(12) United States Patent
Kuwata et al.

(10) Patent No.: US 7,643,601 B2
(45) Date of Patent: Jan. 5, 2010

(54) TIMING EXTRACTION CIRCUIT FOR USE IN OPTICAL RECEIVER THAT USES CLOCK OF FREQUENCY EQUAL TO ONE HALF OF DATA TRANSMISSION RATE, AND DUTY CYCLE DEVIATION HANDLING CIRCUIT FOR USE IN OPTICAL TRANSMITTER AND RECEIVER

(75) Inventors: Naoki Kuwata, Kawasaki (JP); Takuji Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 627 days.

(21) Appl. No.: 10/642,519

(22) Filed: Aug. 18, 2003

(65) Prior Publication Data

US 2004/0062336 A1    Apr. 1, 2004

Related U.S. Application Data

(63) Continuation of application No. PCT/JP01/01139, filed on Feb. 16, 2001.

(51) Int. Cl.
*H03D 3/24* (2006.01)

(52) U.S. Cl. ...................................... 375/376
(58) Field of Classification Search ................. 375/376, 375/354, 371, 373, 374, 375; 327/172, 175
See application file for complete search history.

(56) References Cited

U.S. PATENT DOCUMENTS 5,757,218 A * 5/1998 Blum .......................... 327/175

5,953,386 A    9/1999  Anderson
5,956,378 A *  9/1999  Soda .......................... 375/376
6,687,321 B1 * 2/2004  Kada et al. .................. 375/376

FOREIGN PATENT DOCUMENTS

| JP | 5-110428 | 4/1993 |
|----|----------|--------|
| JP | 7-273648 | 10/1995 |
| JP | 9-135238 | 5/1997 |
| JP | 9-307457 | 11/1997 |
| JP | 2862078 | 12/1998 |
| JP | 11-298459 | 10/1999 |
| JP | 2000-183731 | 6/2000 |
| JP | 2000-323984 | 11/2000 |

* cited by examiner

*Primary Examiner*—Chieh M Fan
*Assistant Examiner*—Jaison Joseph
(74) *Attorney, Agent, or Firm*—Staas & Halsey LLP

(57) ABSTRACT

The invention concerns an optical transmitter and receiver, and provides an improved timing extraction circuit for use in an optical receiver that uses a clock of a frequency equal to one half the data transmission rate, and a duty cycle deviation handling circuit for use in the optical transmitter and receiver. The timing extraction circuit uses a PLL circuit containing a phase comparator circuit for performing a phase comparison between a data signal of bit rate B (bits/s) and a clock signal of B/2 (Hz) at intervals of 2/B (sec), and comprises: a detection circuit for detecting the absence of an output of phase comparison information from the phase comparator circuit by receiving a data signal of a prescribed pattern; and a control circuit for controlling, upon detecting the absence, the phase of the clock signal in order to maintain synchronization. Based on the result of evaluating the duty cycle between the input data before and after the point at which the PLL circuit is locked, the duty cycle deviation handling circuit controls the data discrimination phase before and after that point.

3 Claims, 33 Drawing Sheets

Fig.20
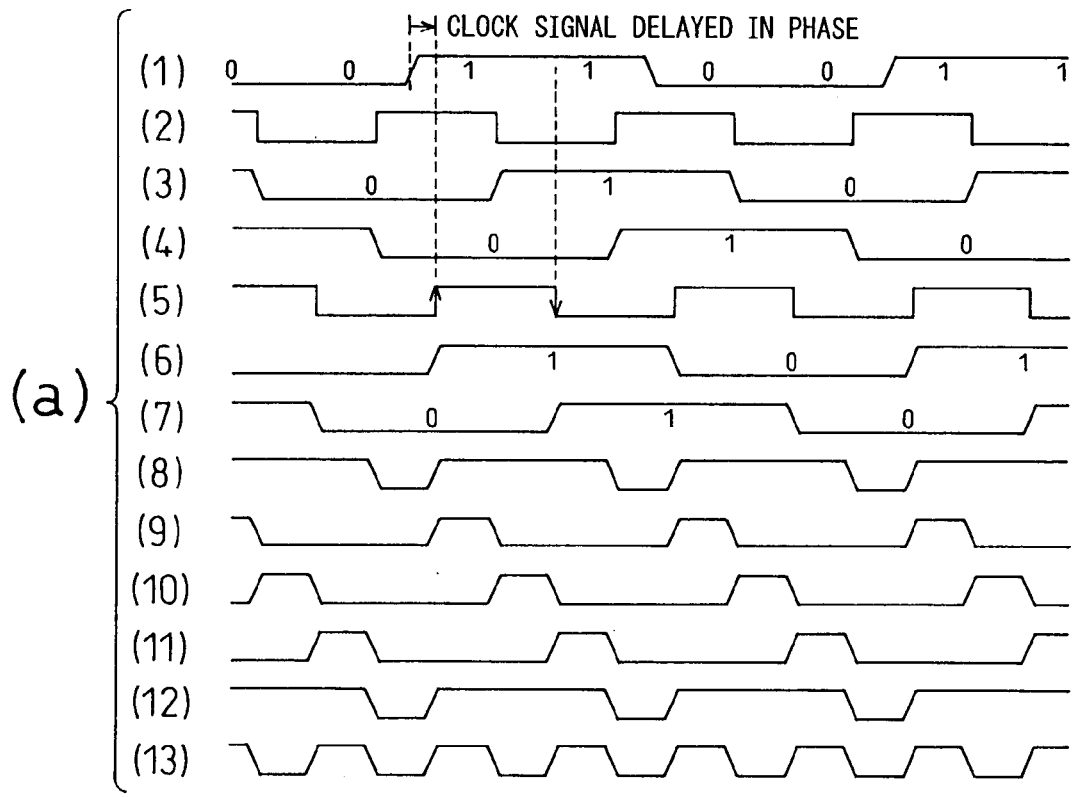
(a)
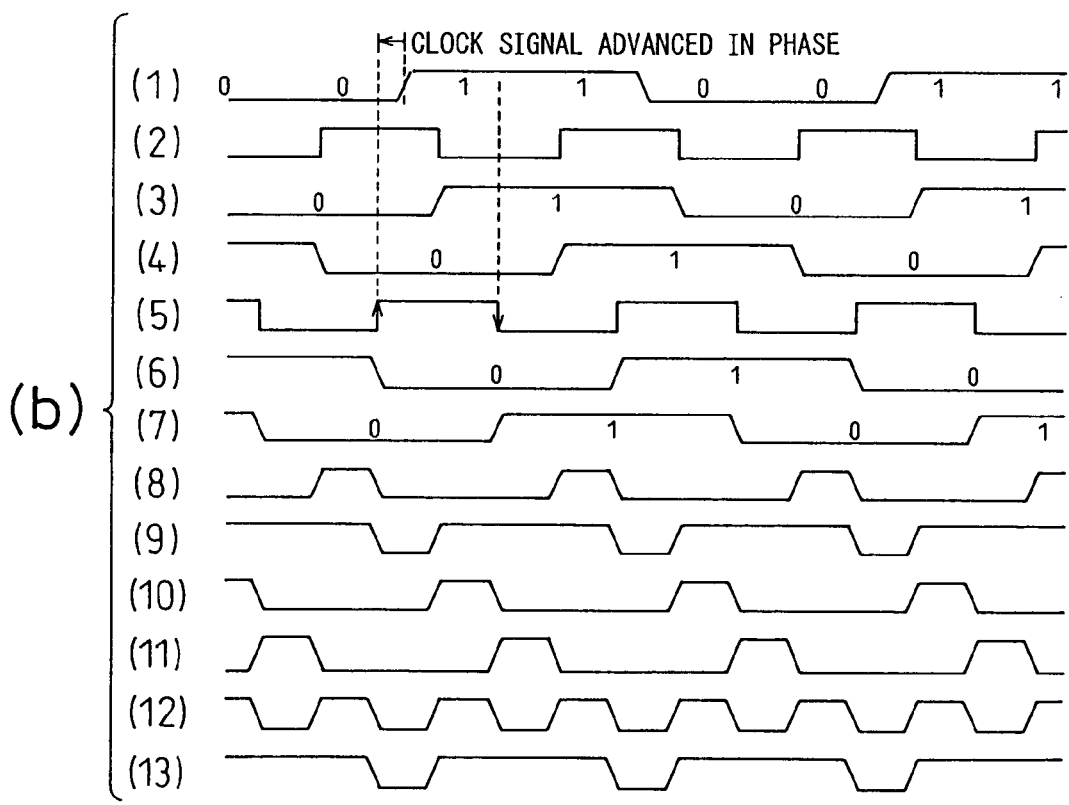
(b)

Fig. 21
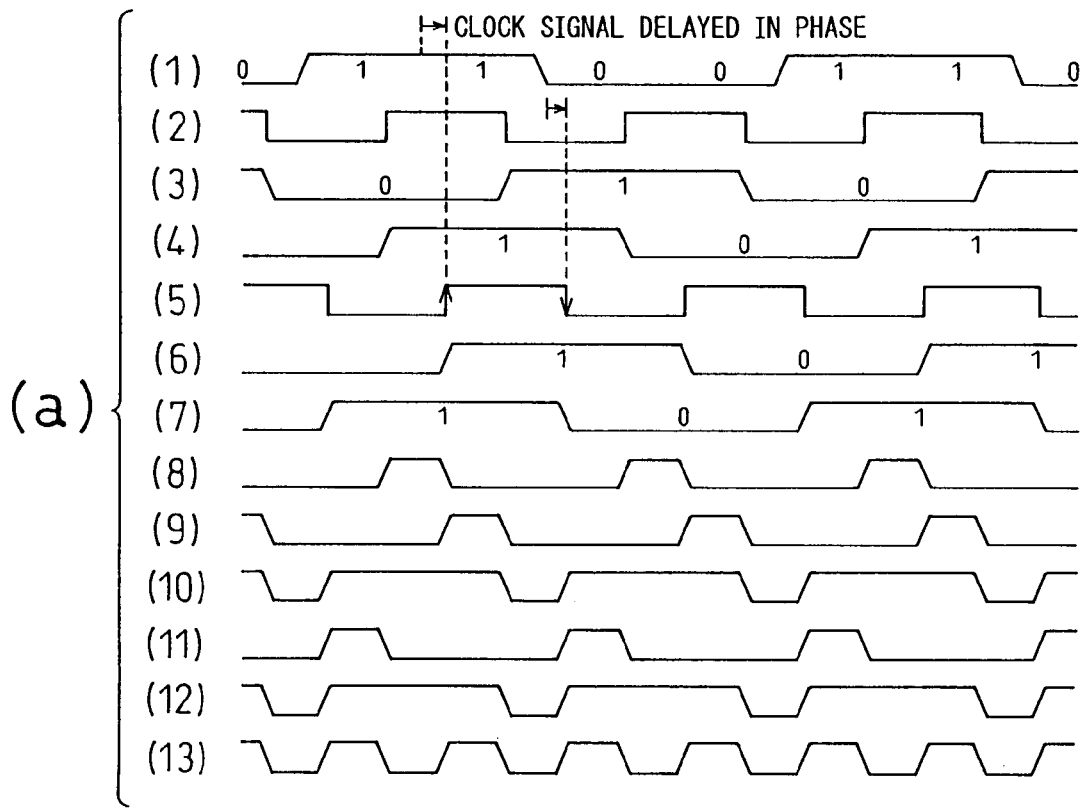
(a)
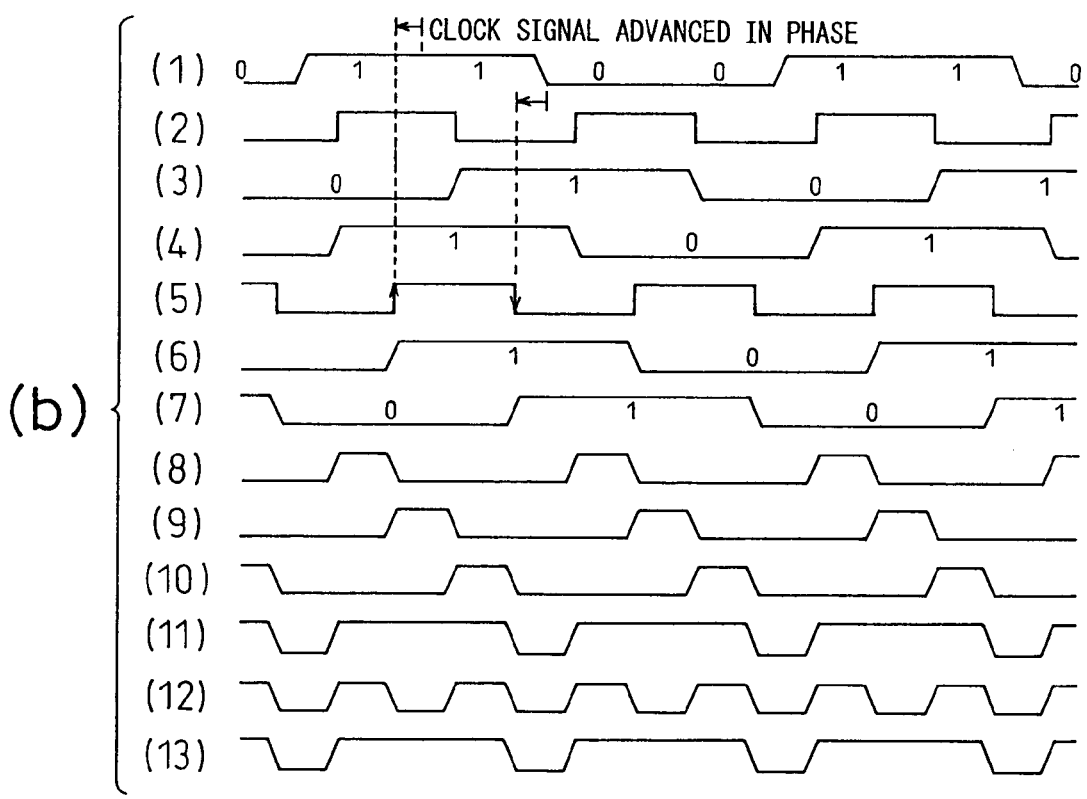
(b)

Fig. 33
(a)
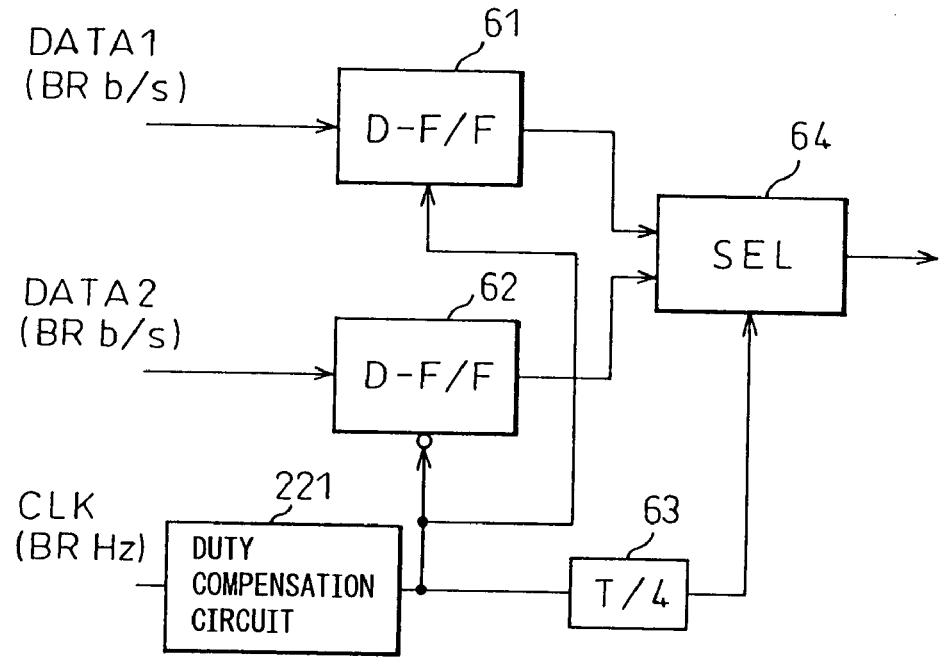
(b)
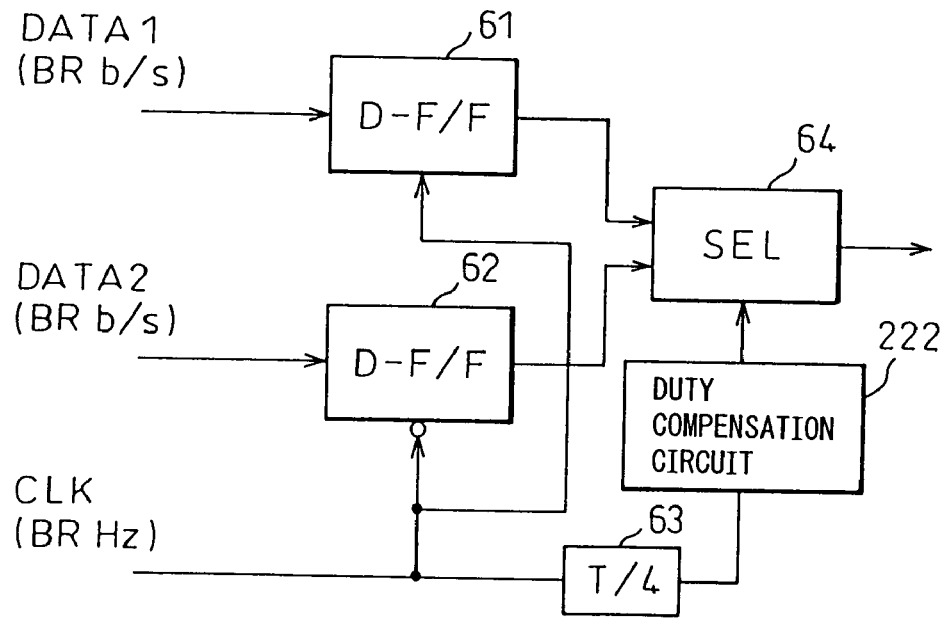

Fig. 34
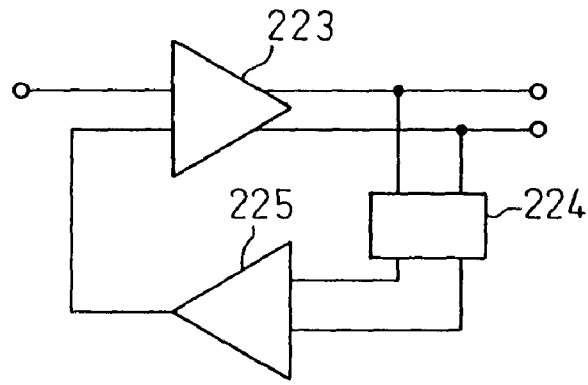
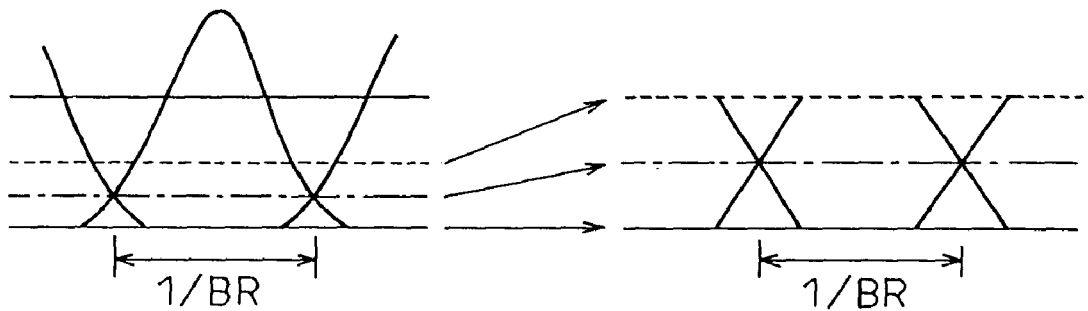
(a) BEFORE COMPENSATION  (b) AFTER COMPENSATION
Fig. 35
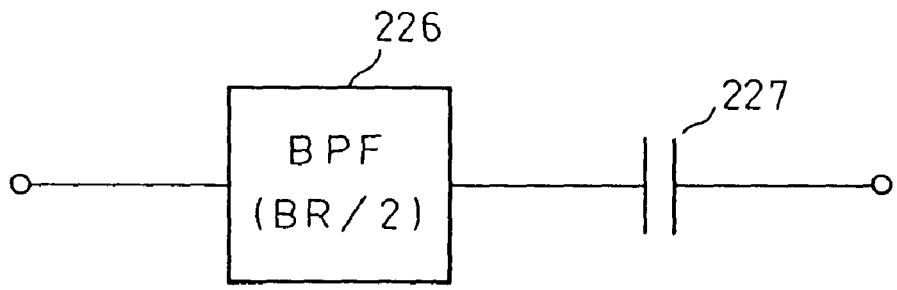

TIMING EXTRACTION CIRCUIT FOR USE IN OPTICAL RECEIVER THAT USES CLOCK OF FREQUENCY EQUAL TO ONE HALF OF DATA TRANSMISSION RATE, AND DUTY CYCLE DEVIATION HANDLING CIRCUIT FOR USE IN OPTICAL TRANSMITTER AND RECEIVER

CROSS-REFERENCE TO RELATED APPLICATION

This application is a continuation application and is based upon PCT/JP01/01139, filed on Feb. 16, 2001.

TECHNICAL FIELD

The present invention relates to an optical transmitter and receiver and, more particularly, relates to a timing extraction circuit for used in an optical receiver that uses a clock of a frequency equal to one half the data transmission rate in a high-speed optical communication system, and a duty cycle deviation handling circuit for use in an optical transmitter and receiver.

For a trunk-line optical communication system connecting between large cities, there is an increasing need for a larger-capacity, ultra-high-speed system in order to meet the future demands of the advancing information society for moving image transmission, data transmission, etc. At 3R repeaters and end offices in an optical communication system, optical signals received by optical signal receivers undergo such processing as optical-to-electrical conversion, equalization and amplification, timing clock extraction, and signal discrimination. Usually, these functions are implemented using integrated circuits. For timing clock extraction, PLL (Phase Locked Loop) technology has come to be used in recent years because of its ease of integration.

BACKGROUND ART

For an early implementation of a long-distance optical fiber transmission system operating at such ultra high speeds as 10 Gb to 40 Gb/s, as it is difficult at the present level of technology to obtain devices having sufficient high-speed characteristics for use in optical transmitter and receiver circuits, there is a need to decrease the operating speed of the entire circuit by reducing the circuitry of high-speed operating blocks to the minimum necessary. Blocks that require the fastest operating speed are the optical transmitter and receiver circuits that directly handle signals at the transmission rate and, in particular, devices operating in synchronism with clock signals tend to be affected by insufficient high-speed characteristics.

FIG. 1 is a diagram showing configuration examples of high-speed optical communication systems according to the prior art.

Part (a) of FIG. 1 concerns an example of a 10 Gb/s optical transmission system, and shows a configuration example of a high-speed optical communication system that uses the so-called fullfrequency clock extraction method that performs data signal discrimination by extracting, from the data signal transmitted at 10 Gb/s, a clock signal of the same frequency as the transmission rate of the transmitted signal.

At an optical transmitter 10, a signal of 10G bit rate (BR) with x signals multiplexed thereon by an x:1 multiplexer (MUX) 11 is waveshaped by a D-flip/flop (D-F/F) 15, and then input to an optical modulator 13 via a driver 14. An optical signal from a laser diode 12 is modulated in the optical modulator 13 by the signal input from the driver, and output as a 10 Gb/s optically modulated signal onto an optical transmission line 20 constructed using an optical fiber.

On the other hand, at an optical receiver 30, the optical signal received from the optical transmission line 20 is converted by a photodiode 31 into an electrical signal which, after being amplified by an amplifier 32, is input to a timing extraction circuit 33 as well as to a discrimination circuit 34. The timing extraction circuit 33 extracts from the input signal a clock signal of 10 GHz which is the same frequency as the transmitted signal. Using the thus extracted clock signal, the discrimination circuit 34 samples the received data signal and discriminates the logic level of the received data signal. After that, the signal is demultiplexed by a 1:x demultiplexing circuit (DEMUX) 35 into the x original signals.

Part (b) of FIG. 1 concerns an example of a higher-speed system, i.e., a 40 Gb/s optical transmission system, and shows a configuration example of a high-speed optical communication system that uses the so-called half-frequency clock extraction method that performs data signal discrimination by extracting, from the data signal transmitted at 40 Gb/s, a clock signal of a frequency equal to one half the transmission rate of the transmitted signal. The following deals only with differences from part (a) of FIG. 1 described above.

First, at the transmitter 10, the D-flip/flop (D-F/F) 15 for waveshaping is omitted. The main reason for this is that, at the present level of technology, it is difficult to fabricate a clocking device that would properly operate at 40 Gb/s (bit width of 25 ps). In the illustrated example, therefore, using the half-frequency clock (BR/2=20 GHz), the signal with x signals multiplexed thereon is selectively output from the multiplexer (MUX) 11 for every half clock cycle, thereby extracting the 40 Gb/s data signal. The data signal directly drives the driver 14, and the 40 Gb/s data signal is output from the optical modulator 13 onto the optical transmission line 20.

Next, at the optical receiver 30, a half-period clock signal (BR/2=20 GHz), one half the bit rate of the received data, is extracted from the received 40 Gb/s data signal by a timing extractor 36 and is output. Then, using normal and inverted clock edge signals for every half cycle period and two discriminators 37 and 38, two data bits (one bit per half cycle period=40 Gb/s) are discriminated for every full clock period. The two discriminated data signals are demultiplexed by a 2:x demultiplexing circuit (DEMUX) 39 at the subsequent stage into the original x signals.

FIG. 2 shows an example of the circuit configuration of the timing extractor 33 and discriminator 34 that uses the full-frequency clock extraction method shown in part (a) of FIG. 1. FIG. 4 is a timing chart showing an example of operation at each point indicated by a parenthesized number in FIG. 2. FIG. 3 shows an example of the circuit configuration of the timing extractor 36 and discriminators 37 and 38 that uses the half-frequency clock extraction method shown in part (b) of FIG. 1. FIG. 5 is a timing chart showing an example of operation at each point indicated by a parenthesized number in FIG. 3. The basic operation of these circuits will be described briefly below.

The received data signal (1) is input to a two-stage cascade of D-flip/flops 41 and 42, which corresponds to the discrimination circuit 34 in part (a) of FIG. 1, and a signal (3) synchronized to the clock and a signal (4) delayed by one bit from the signal (3) are generated using a clock rising edge signal from a PLL (Phase Locked Loop) circuit in the lower part of the figure. The received data signal (1) is also input to another twostage cascade of D-flip/flops 43 and 44. Here, however, the first-stage D-flip/flop 43 is latched by a clock falling edge signal, and the second-stage D-flip/flop 44 is latched by a clock rising edge signal. As a result, a synchronized signal (5) delayed by a half cycle period from the synchronized signal (3) and a synchronized signal (6) delayed by a further half cycle period (thus in phase with the synchronized signal (4)) are generated. Next, the synchronized signals (4) and (6) are exclusive-ORed together to produce an EXOR output signal (8), and the synchronized signals (3) and (6) are exclusive-ORed together to produce an EXOR output signal (7); these output signals are compared in a comparator circuit 47, and the result of the comparison is fed via a loop filter 48 to control a voltage-controlled oscillator (VCO) 49.

Here, by noting the phase relationship between the rising/falling edge of the received data signal (1) and the falling edge of the clock signal (2), use is made of the fact that the EXOR output signals (7) and (8) vary depending on which edge comes first. As shown in part (a) of FIG. 4, when the falling edge of the clock output signal (2) from the VCO 49 is delayed with respect to the changing edge of the received data signal (1) (delayed in phase), the synchronized signals (3) and (6) are identical to each other, and the EXOR output signal (7) is therefore at a low level. Conversely, as shown in part (b) of FIG. 4, when the falling edge of the clock output signal (2) from the VCO 49 is advanced with respect to the changing edge of the received data signal (1) (advanced in phase), the synchronized signals (4) and (6) are identical to each other, and the EXOR output signal (8) is therefore at a low level. On the other hand, when the input signal pattern is random, and its mark-space ratio is 1/2, in the case of the delayed phase the average voltage of the EXOR output signal (8) is at a value intermediate between the high and low levels. In the case of the advanced phase, on the other hand, the average voltage of the EXOR output signal (7) is at a value intermediate between the high and low levels. Accordingly, the phase relationship between the data signal and the clock signal can be detected based on the difference between the average voltages of the EXOR output signals (7) and (8). In the illustrated example, the result of the comparison from the comparator circuit 47, constructed using a binary phase comparator circuit, is fed via the loop filter (low-pass filter) 48 to control the VCO 49 in such a manner as to reduce the phase difference to zero. More specifically, in the illustrated example, the phase is controlled so that the falling edge of the clock output signal (2) always coincides with the changing edge of the received data signal (1), and signal discrimination is performed using the two edge signals appearing before and after the falling edge.

Next, an example of the circuit operation of the half-frequency clock extraction method shown in FIGS. 3 and 5 will be described. Here, the oscillation center frequency of the VCO 50 is equal to one half the bit rate of the received data signal (1). The received data signal (1) is input to two D-flip/flops 51 and 52, which correspond to the discrimination circuits 37 and 38 in part (b) of FIG. 1, and signals (3) and (4) respectively synchronized to the falling and rising edge signals from the PLL circuit in the lower part of the figure are generated. The received data signal (1) is also input to a D-flip/flop 53; here, the clock signal output from the VCO 50 is supplied via a T/2 delay circuit 54 (T/2=¼ clock cycle period, T=half clock cycle period), and a signal (6) synchronized to the rising edge of the clock signal is generated.

The process thereafter is the same as that described with reference to FIG. 2; that is, the exclusive OR (EXOR) output signal (8) between the synchronized signals (4) and (6) and the EXOR output signal (7) between the synchronized signals (3) and (6) are produced, and the comparator circuit 47 compares these output signals and supplies the result of the comparison via the loop filter 48 to control the voltage-controlled oscillator (in this example, the VCO 50). As shown in part (a) of FIG. 5, when the rising edge of the ¼ cycle delayed clock signal (5) from the VCO 50 is delayed with respect to the changing edge of the received data signal (1), the synchronized signals (3) and (6) coincide with each other for a ¾ clock cycle period, during which the EXOR output signal (7) is held at the low level. Conversely, as shown in part (b) of FIG. 5, when the rising edge of the clock signal (5) from the VCO 50 is advanced with respect to the changing edge of the received data signal (1), the synchronized signals (4) and (6) coincide with each other for a ¾ clock cycle period, during which the EXOR output signal (8) is held at the low level. The result of the comparison from the comparator circuit 47 is fed to control the VCO 50 at the subsequent stage in such a manner as to reduce the phase difference to zero. More specifically, in the illustrated example, the phase controlled so that the rising edge of the clock signal always coincides with the changing edge of the received data signal (1), and signal discrimination is performed using the two edge signals appearing before and after the rising edge. In this way, the half-frequency clock extraction method offers an enormous advantage in that the half-frequency clock can be used while using the substantially the same hardware configuration as that for the full-frequency clock method.

However, the half-frequency clock extraction method has had the problem that when comparing the phase between the clock signal and the data signal, if a specific data signal pattern "1100" is repeated in succession, the phase comparison signal cannot be obtained, which has not beer the case with the traditional full-frequency clock extraction method.

FIGS. 6 and 7 show timing chart examples of two phase relationships A and B for the signal pattern "1100" in question. FIG. 6 shows the case where the clock signal is delayed in phase (a) and the case where it is advanced in phase (b); in the illustrated example, as the rising edge of the clock signal (5) is within the phase control range relative to the change point ("0" to "1" or "1" to "0") of the received data signal (1), a difference 35 occurs between the level average values of the synchronized signals (7) and (8) (phase relationship A). Therefore, as in the case of FIG. 5, by comparing the levels of the synchronized signals (7) and (8), phase control is performed so that the clock rising edge coincides with the changing edge of the received data signal (1). FIG. 7 also shows the case where the clock signal is delayed in phase (a) and the case where it is advanced in phase (b), but in this example, as the rising edge of the clock signal (5) occurs at the same-level transitioning point ("0" to "0" or "1" to "1") of the received data signal (1), the synchronized signals (7) and (8) are the same in waveform, and therefore, their level average values are also the same (phase relationship B). As a result, during that period, phase detection cannot be performed, giving rise to the possibility of the PLL running out of synchronization.

In this way, for phase comparison, a low-to-high or a high-to-low level transition of the data signal is needed, but in the case of the half-frequency clock extraction method, all the data signal changes are not used for phase comparison, but only one in every two changes is used, as shown in FIGS. 6 and 7. As a result, while the phase can be detected in the case of the phase relationship A of FIG. 6, the phase cannot be detected in the case of the phase relationship B of FIG. 7. One possible way to address this problem would be to scramble the data signal, but in the example of a 10 Gb/s optical transmission system, the "1100" pattern is actually used over a length of 1528 bits (in the case of a system conforming to Bellcore Generic Requirements GR-1377-CORE, "SONET OC-192 Transport System Generic Criteria"), and in the case of a higher-speed system also, there is the possibility of the "1100" pattern being used over a length of several thousand bits in succession. If the half-frequency clock extraction method is used for such systems, there can arise the problem that the phase deviation of the PLL increases or the PLL runs out of synchronization, as described above.

As another problem, in the case of the system configuration shown in part (b) of FIG. 1 for performing ultra high-speed optical communications at 40 Gb/s, waveshaping by a D-F/F clocked at the data transmission rate is not performed at the final stage of the optical transmitter 10. This can lead to a problem such as shown in FIGS. 8 and 9.

FIG. 8 is a diagram showing a circuit configuration example of an output stage of a 2:1 multiplexing circuit. FIG. 9 shows a waveform example of each signal shown in FIG. 8 and the clock versus data discrimination timing relationship according to the half-frequency clock extraction method at the optical receiver side.

In FIG. 8, 20 Gb/s serial data (DATAL) is input to a D-flip/flop 61, while 20 Gb/s serial data (DATA2) is input to a D-flip/flop 62. In the illustrated example, the 20 GHz clock signal shown in part (a) of FIG. 9, whose duty cycle is deviated, is applied as is to the clock terminal of the D-flip/flop 61, and its inverted clock signal is applied to the clock terminal of the D-flip/flop 62. The clock signal is also applied to control a selector 64 via a delay circuit (T/4=⅛ clock cycle period) 63 provided to compensate for the operation delay times of the D-flip/flops 61 and 62, and the selector 64 selects one or the other of the outputs of the two D-flip/flops 61 and 62 for output by switching between them for every half clock cycle. As a result, 40 Gb/s data is output from the selector 64, but as shown in part (b) of FIG. 9, a data signal whose duty cycle is deviated is output every other bit because of the duty deviation of the clock signal.

When discriminating the received data at the optical receiver 30 by using the half-frequency clock extraction method, the problem has been that, as shown in part (c) of FIG. 9, there is no sampling margin at one of the data discrimination (sampling) points located symmetrically about the PLL phase lock clock signal at the center. As a result, even if the data discrimination phase for either one is adjusted, since there are two phase lock points (change points from "narrow to wide" or "wide" to "narrow" of the duty cycle) in the half-frequency clock extraction method, it has not been possible to solve the problem of the data discrimination phase eventually deviating from the set point.

DISCLOSURE OF THE INVENTION

In view of the above situation, it is an object of the present invention to provide a timing extraction circuit for an optical receiver that uses an improved half-frequency clock extraction method that has a characteristic comparable to the traditional fullfrequency clock extraction method even for a specific signal pattern.

It is another object of the present invention to provide, in an optical receiver using the half-frequency clock extraction method, a duty cycle deviation handling circuit that controls discrimination phase automatically, or by initial setting, by determining whether the duty cycle of the received data signal is wide or narrow. At this time, a more precise setting of discrimination phase is achieved by adjusting the discrimination phase of the clock signal used to discriminate the data signal and the discrimination phase of its inverted clock signal independently of each other.

It is still another object of the present invention to provide, in an optical transmitter, a duty cycle deviation handling circuit that compensates for the duty cycle of the clock waveform used in a 2:1 multiplexing circuit.

According to the present invention, there is provided a timing extraction circuit which uses a PLL circuit containing a phase comparator circuit for performing a phase comparison between a data signal of bit rate B (bits/s) and a clock signal of B/2 (Hz) at intervals of 2/B (sec), and comprises: a detection circuit for detecting the absence of an output of phase comparison information from the phase comparator circuit by receiving a data signal of a prescribed pattern; and a control circuit for controlling, upon detecting the absence, the phase of the clock signal in order to maintain synchronization. There is also provided a timing extraction circuit which uses a PLL circuit containing a phase comparator circuit for performing a phase comparison between a data signal of bit rate B (bits/s) and a clock signal of B/2 (Hz) at intervals of 2/B (sec), wherein the phase comparator circuit comprises two phase comparator circuits which respectively accept phases differing by one cycle (1/B sec) of the data signal to perform phase comparisons for all data signals.

According to the present invention, there is also provided a duty cycle deviation handling circuit for use in an optical receiver, comprising: a PLL circuit containing a phase comparator circuit for performing a phase comparison between a data signal of bit rate B (bits/s) and a clock signal of B/2 (Hz) at intervals of 2/B (sec); a duty cycle evaluation circuit for evaluating a duty cycle between input data before and after a point at which the PLL circuit is locked; and a control circuit for controlling, based on a result of the evaluation, a data discrimination phase before and after the point at which the PLL circuit is locked. The control circuit includes an initial phase setting circuit in which desired duty cycle information is set, wherein the initial phase setting circuit compares the duty cycle at the time of initial phase adjustment with the desired duty cycle information and, when locked in phase in the same condition as the desired duty cycle information, the locked condition is maintained, but when locked in phase in a condition different from the desired duty cycle information, a clock output of a voltage-controlled oscillator in the PLL circuit is inverted. The control circuit adjusts the discrimination phases of the clock signal and the inverted version thereof for discriminating the data signal independently of each other by adjusting the phase of the clock signal independently of the phase of the clock signal delayed in phase by one half cycle of the data signal.

BRIEF DESCRIPTION OF THE DRAWINGS

FIG. 20 is a timing chart (3) for FIG. 17.

FIG. 21 is a timing chart (4) for FIG. 17.

FIG. 33 is a diagram showing a fifth embodiment according to the present invention.

FIG. 34 is a diagram showing a specific implementation (1) of the fifth embodiment.

FIG. 35 is a diagram showing a specific implementation (2) of the fifth embodiment.

BEST MODE FOR CARRYING OUT THE INVENTION

Figure 10:
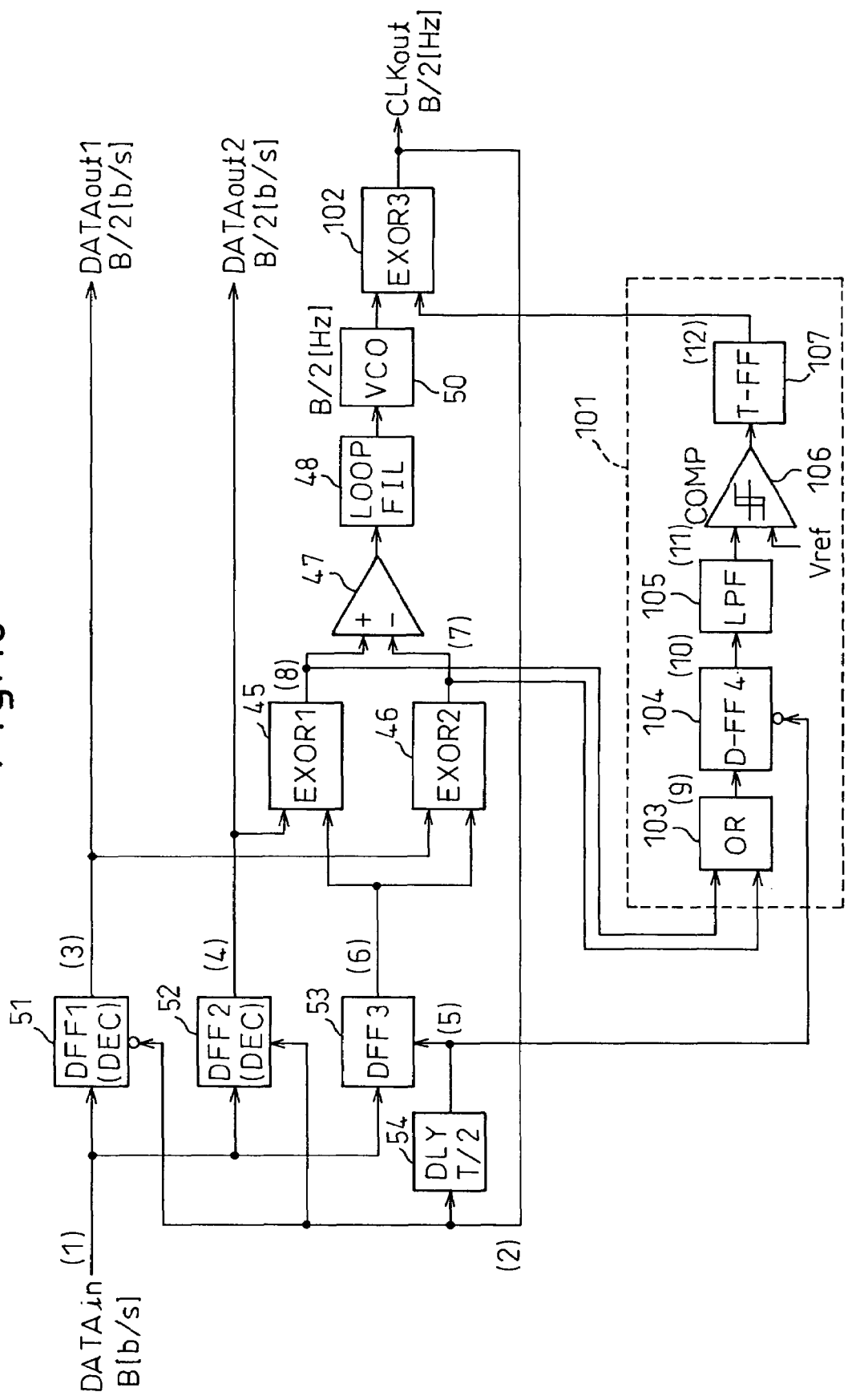
FIG. 10 is a diagram showing a first embodiment according to the present invention.
Figure 11:
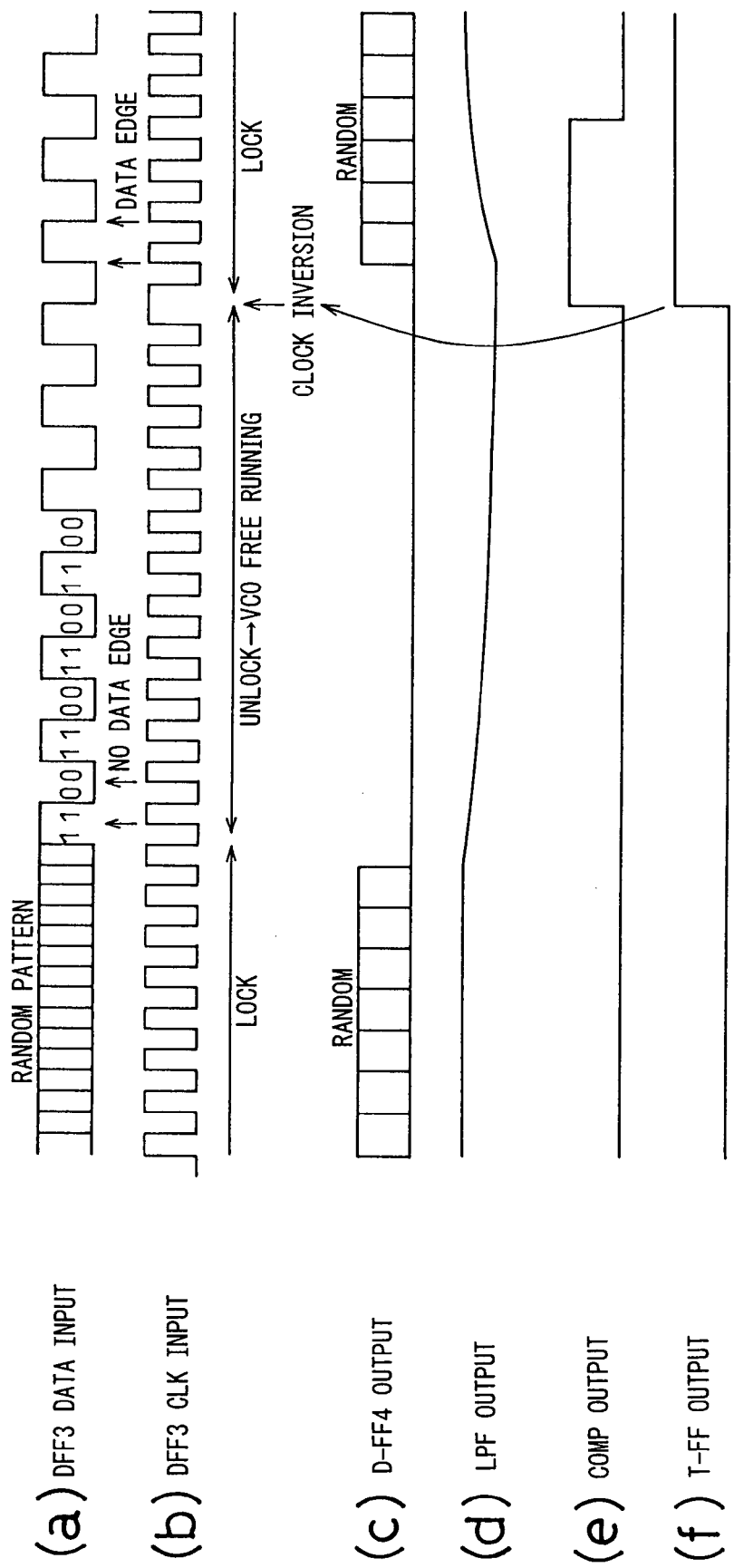
FIG. 11 is a diagram showing the operating principle of FIG. 10.

FIG. 10 is a diagram showing a first embodiment according to the present invention. FIG. 11 shows the operating principle of FIG. 10. In this embodiment, when the previously described phase relationship B is detected, the phase of the clock signal is controlled in such a manner as to bring the phase relationship back to the phase relationship A. More specifically, the phase relationship B is corrected to the phase relationship A by inverting the clock signal. In the data signal pattern primarily used in a 10 Gb/s optical transmission system today, a continuous series of 1100 patterns is repeated periodically, but as one repetition cycle consists of an even number of bits, once the PLL is locked with the phase relationship A, the phase relationship B does not occur in the subsequent cycles.

Figure 1:
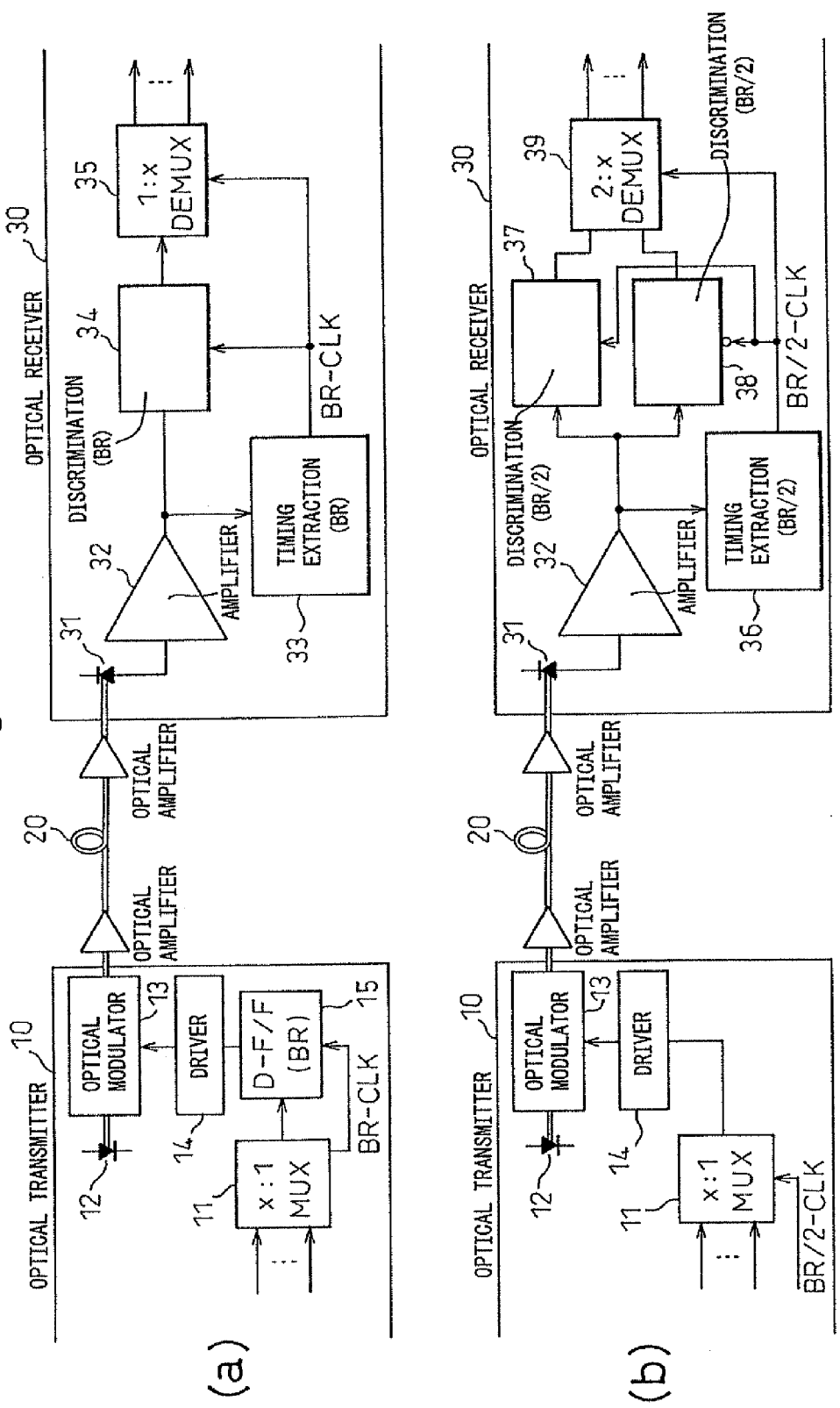
FIG. 1 is a diagram showing configuration examples of high-speed optical communication systems according to the prior art.
Figure 2:
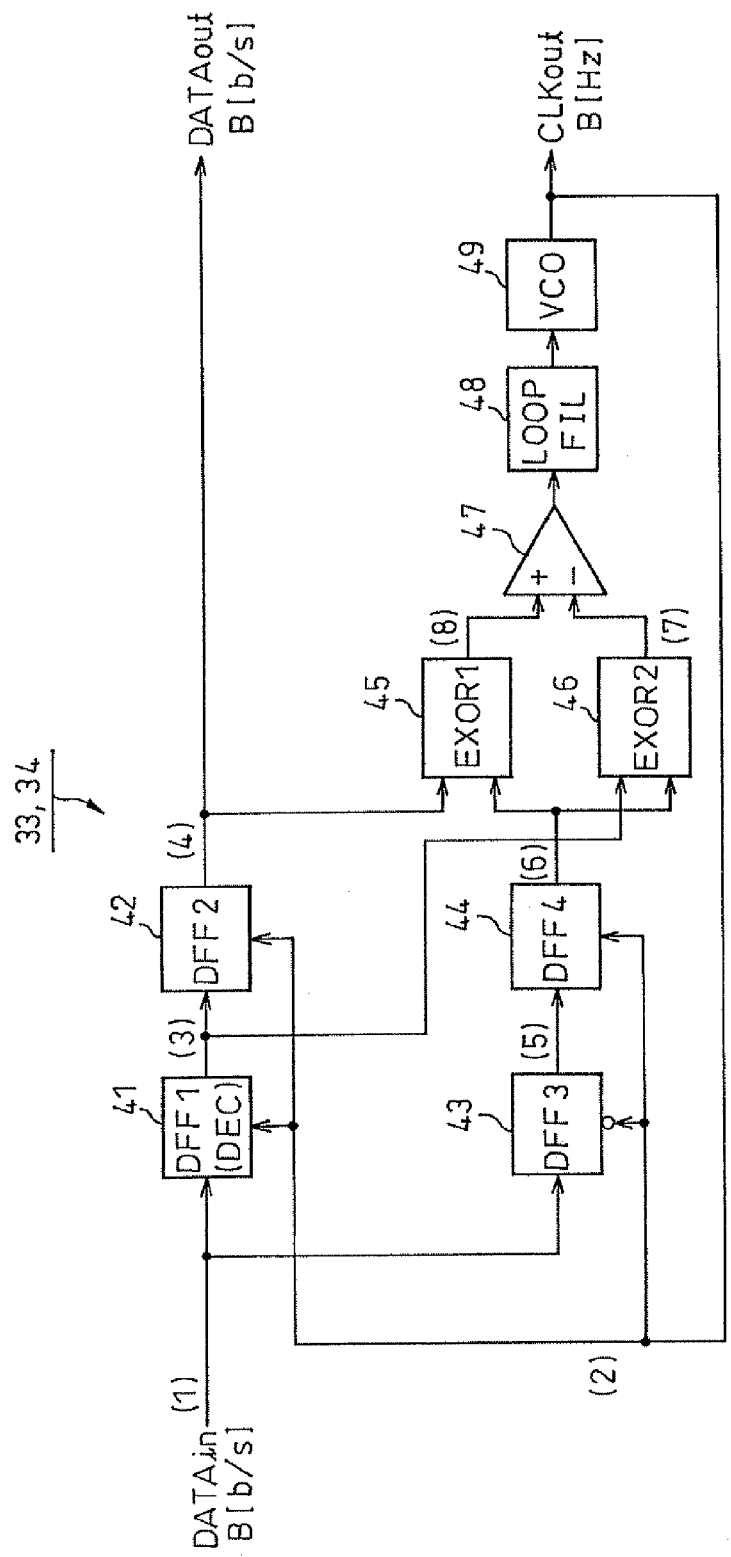
FIG. 2 is a diagram showing one example of a full-frequency clock extraction method.
Figure 3:
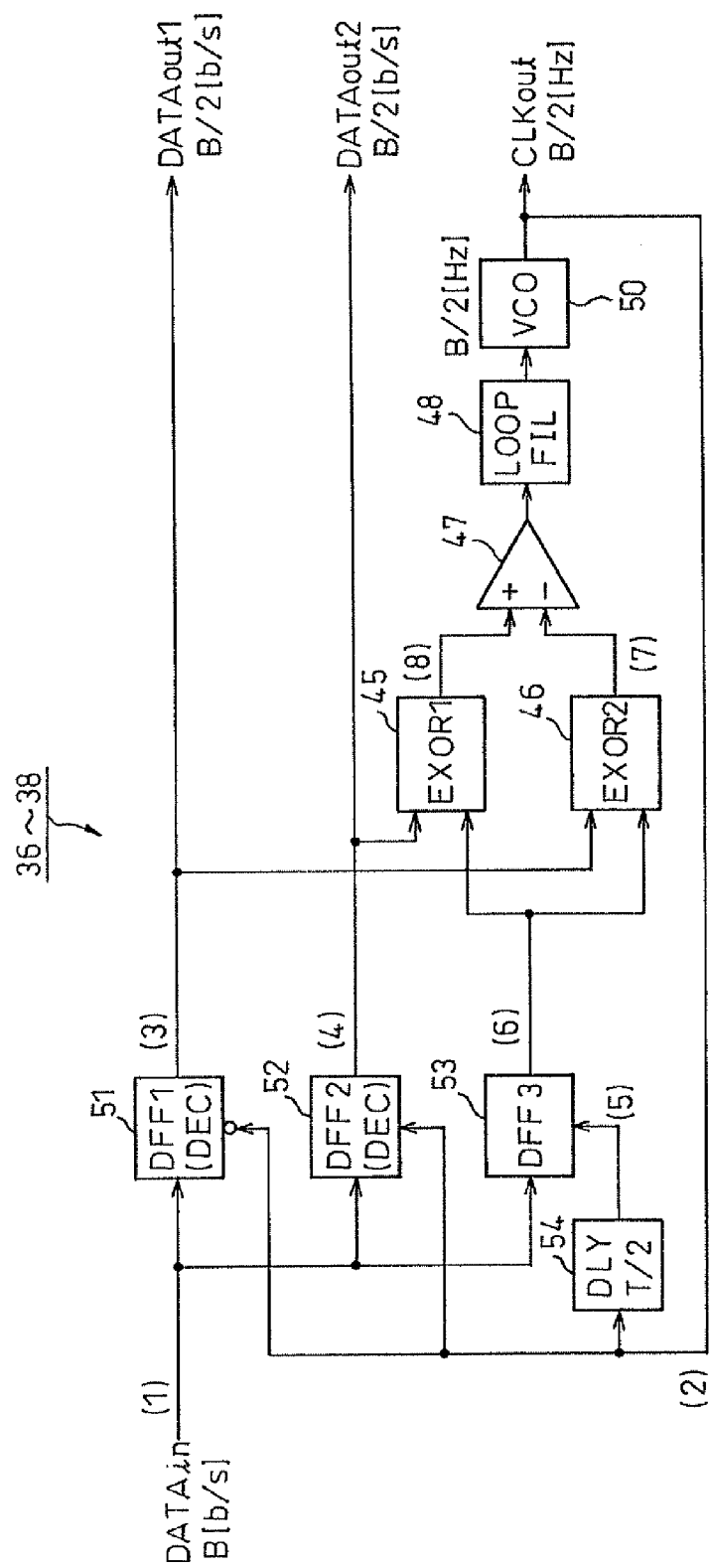
FIG. 3 is a diagram showing one example of a half-frequency clock extraction method.
Figure 4:
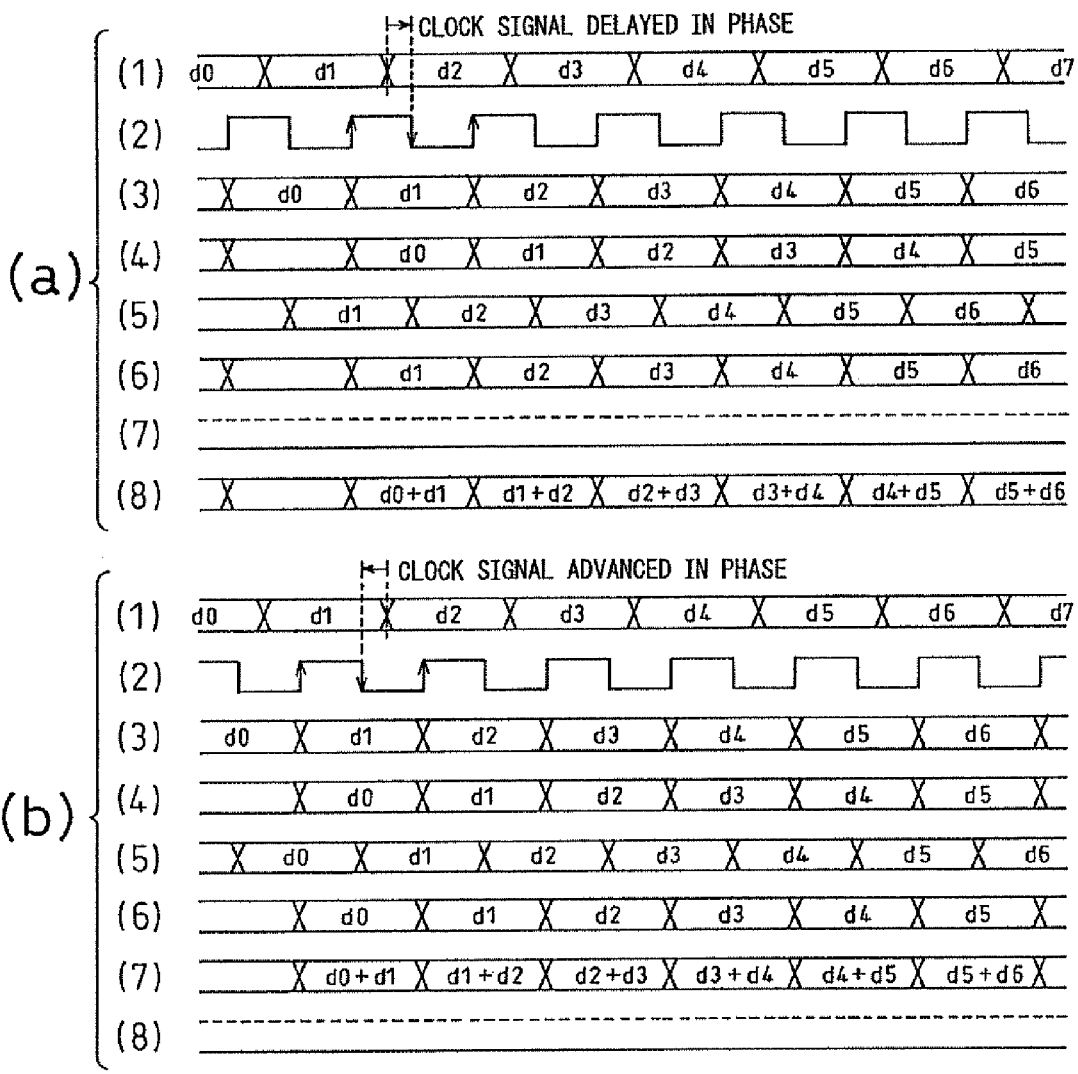
FIG. 4 is a timing chart for FIG. 2.
Figure 6:
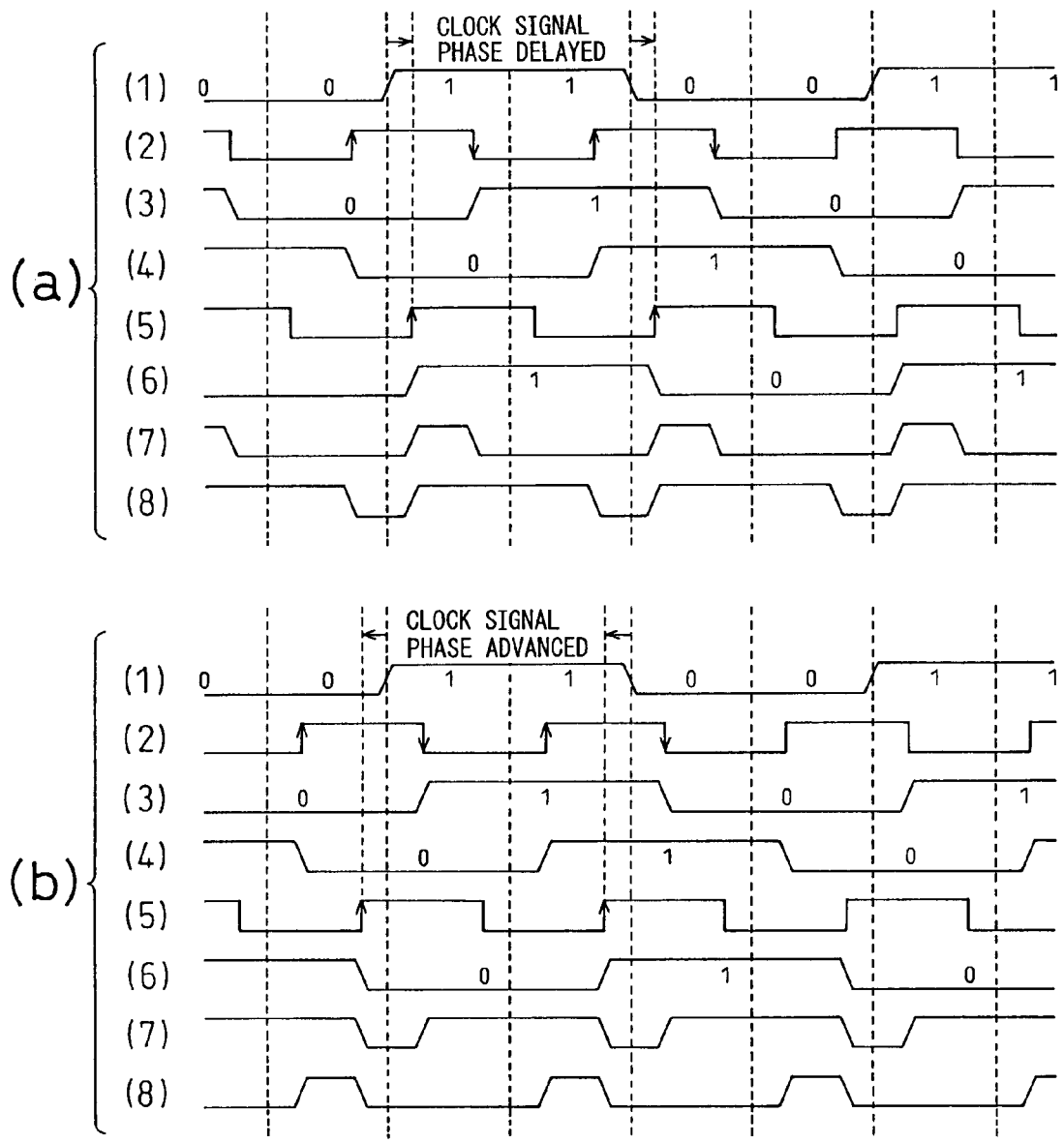
FIG. 6 is a timing chart illustrating phase relationship A.

In FIG. 10, the same elements as those in FIG. 3 are designated by the same reference numerals. A 1100 pattern continuous input handling circuit 101 newly provided in the present embodiment includes a D-flip/flop 104 which latches the OR of the synchronized signals (8) and (7) output from the EXOR circuits 45 and 46, by a clock signal produced by inverting the clock signal supplied from the T/2 delay circuit 54. When the 1100 pattern is input in succession, as shown in part (a) of FIG. 11, and the phase relationship is B, any signal latched at this timing is a low level signal, as indicated by mark (x) in FIG. 7 previously described. As a result, as shown in part (d) of FIG. 11, the output of a low-pass filter 105 at the next stage gradually decreases, eventually dropping below a reference potential for a comparator 106 and causing the output of a T-flip/flop 107 to become inverted (part (f) in FIG. 11). An EXOR circuit 102 provided in the present embodiment EXORs this inverted signal with the clock signal and outputs an inverted clock signal. Upon the inversion of the clock signal, the PLL circuit that has been operating in the phase relationship B shown in FIG. 7 makes a transition to the phase relationship A shown in FIG. 6. Thereafter, the proper lock condition is maintained even if the 1100 pattern is input in succession.

FIGS. 12 to 19 show specific implementations of the first embodiment of the present invention.

Figure 12:
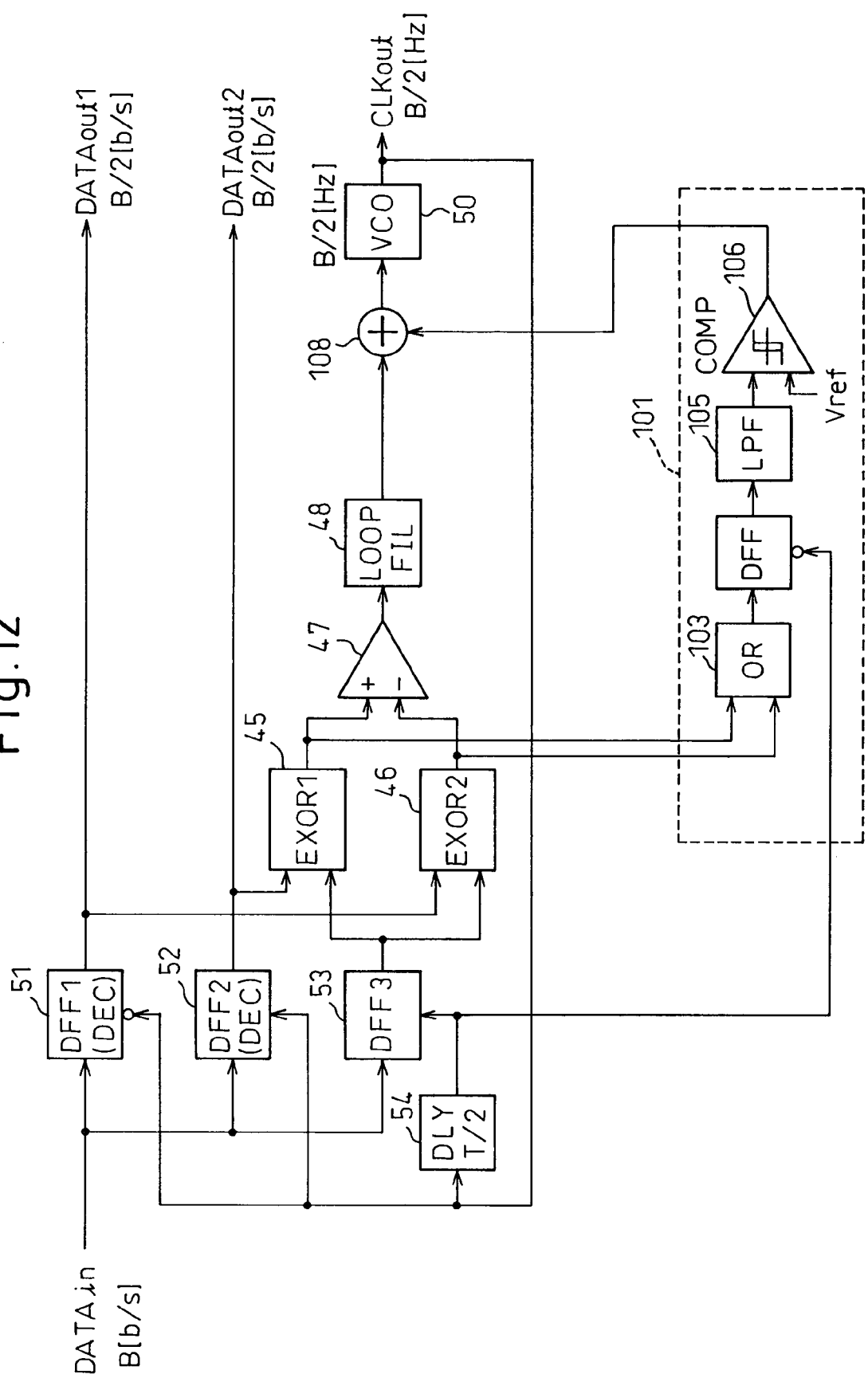
FIG. 12 is a diagram showing a specific implementation (1) of the first embodiment.
Figure 13:
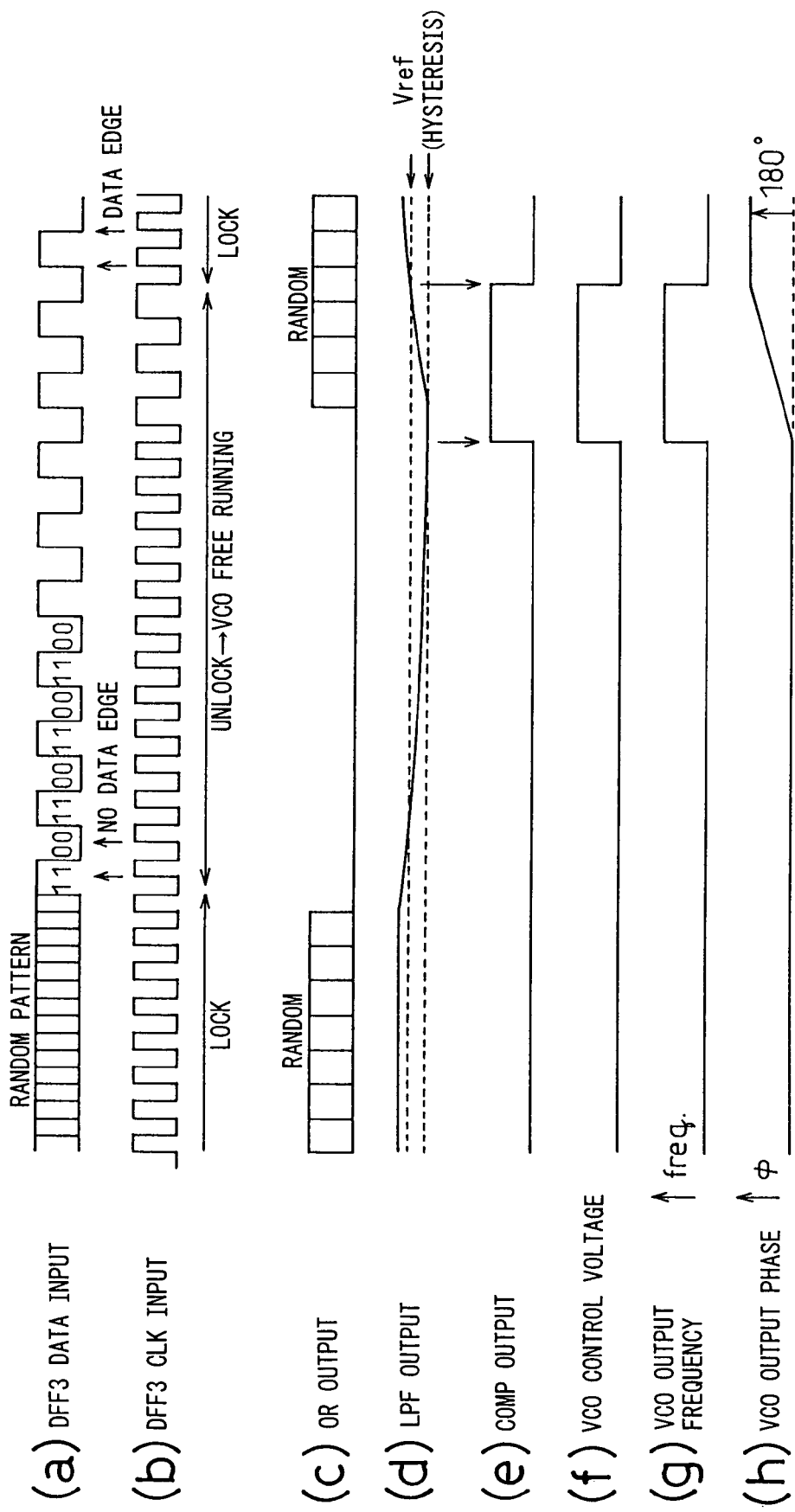
FIG. 13 is a timing chart for FIG. 12.

In FIG. 12, the EXOR circuit 102 used in FIG. 11 to change the phase of the clock signal is replaced by an adder circuit 108 that directly controls the control voltage applied to the VCO 50. Operation in FIG. 12 will be briefly described with reference to FIG. 13. When the 1100 pattern is input in succession, and the output of the comparator 106 goes to the high level as shown in part (e) of FIG. 13, a small constant voltage, in addition to the loop filter output, is applied via the adder circuit 108 to the control terminal of the VCO 50 (part (f) of FIG. 13). As the oscillation frequency of the VCO 50 is proportional to the control voltage, the frequency slightly shifts by a prescribed frequency during the period that the constant voltage is applied. The output phase of the VCO 50, which is proportional to the integral value of the control voltage, gradually changes during the period that the frequency is shifted. As the phase changes, it becomes possible to compare the phase with that of the data signal, and the OR circuit 103 outputs a high level signal. As a result, as shown in parts (g) and (h) of FIG. 13, the output of the comparator 106 goes to the low level, and the oscillation frequency of the VCO returns to its original state, but the phase of the clock signal is maintained at the 180 degree shifted position by the action of the PLL.

Figure 7:
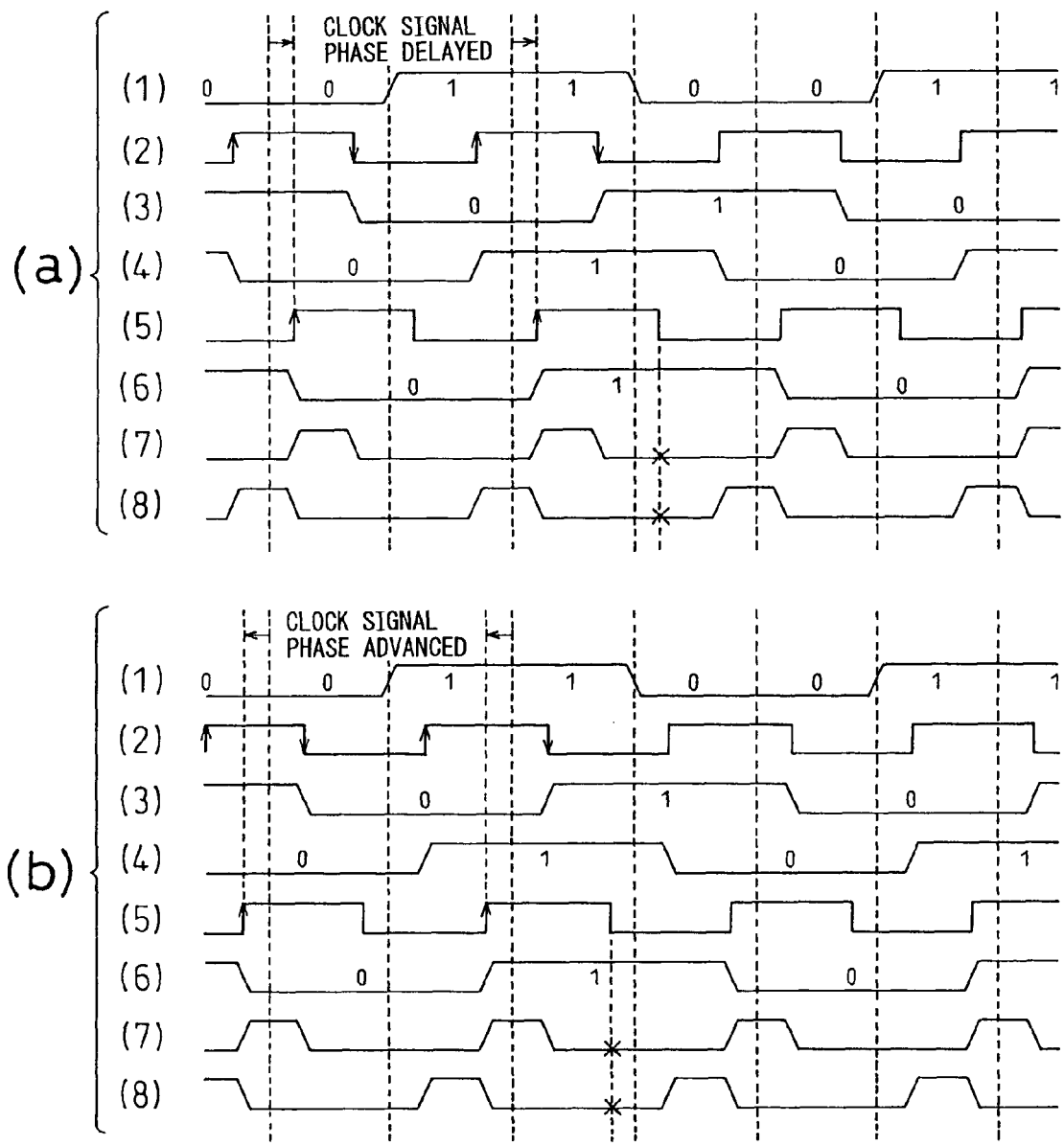
FIG. 7 is a timing chart illustrating phase relationship B.
Figure 14:
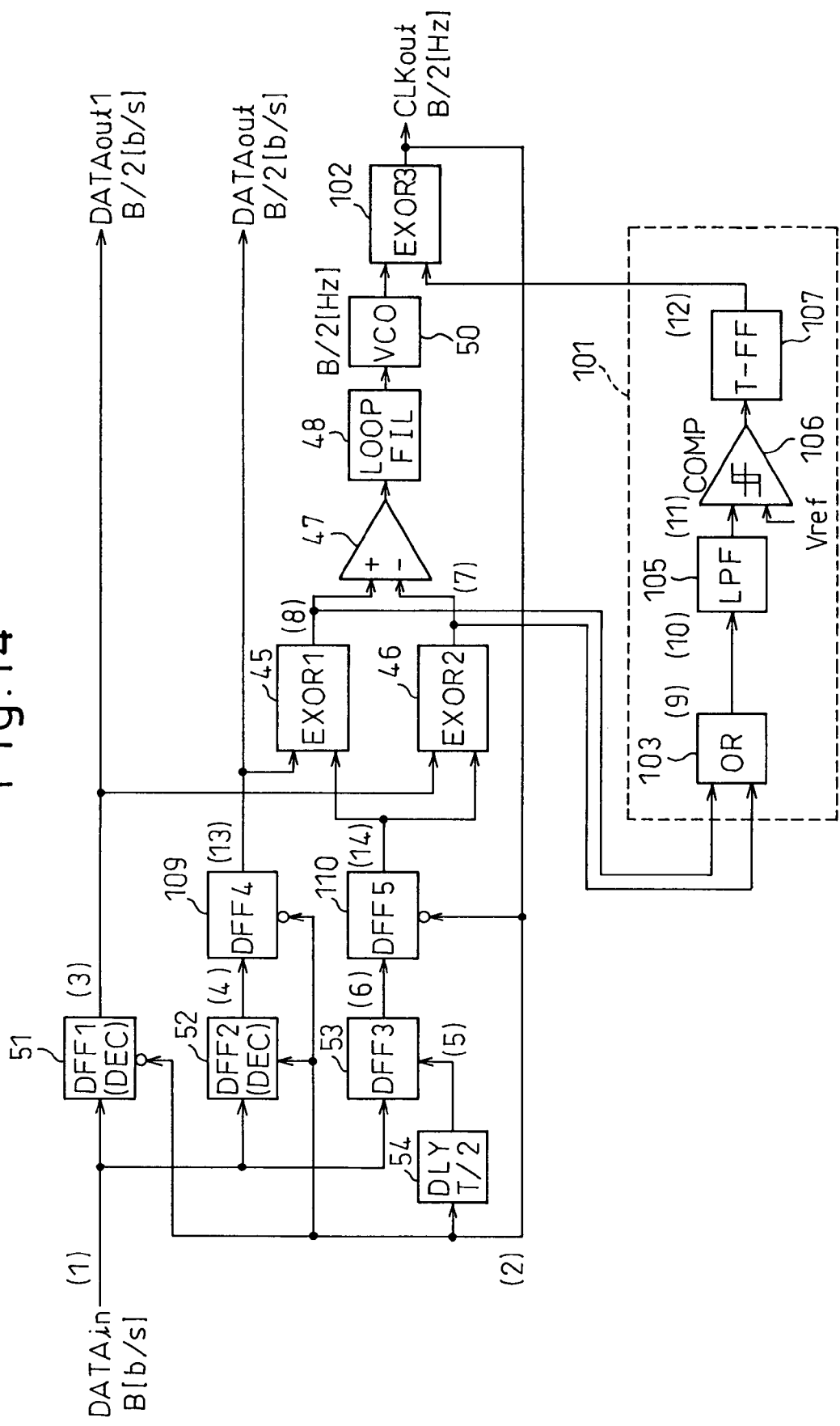
FIG. 14 is a diagram showing a specific implementation (2) of the first embodiment.
Figure 15:
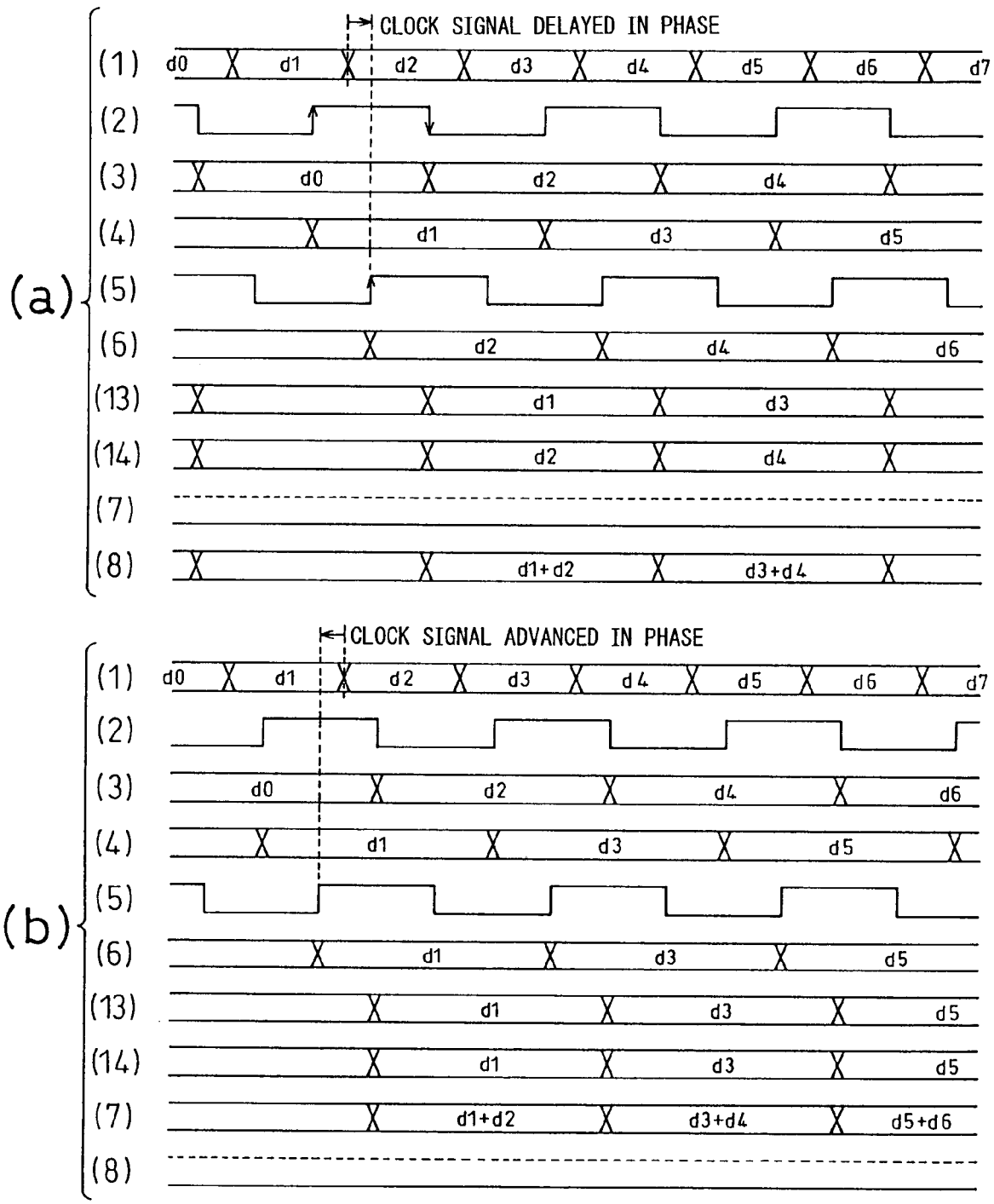
FIG. 15 is a timing chart for FIG. 14.
Figure 16:
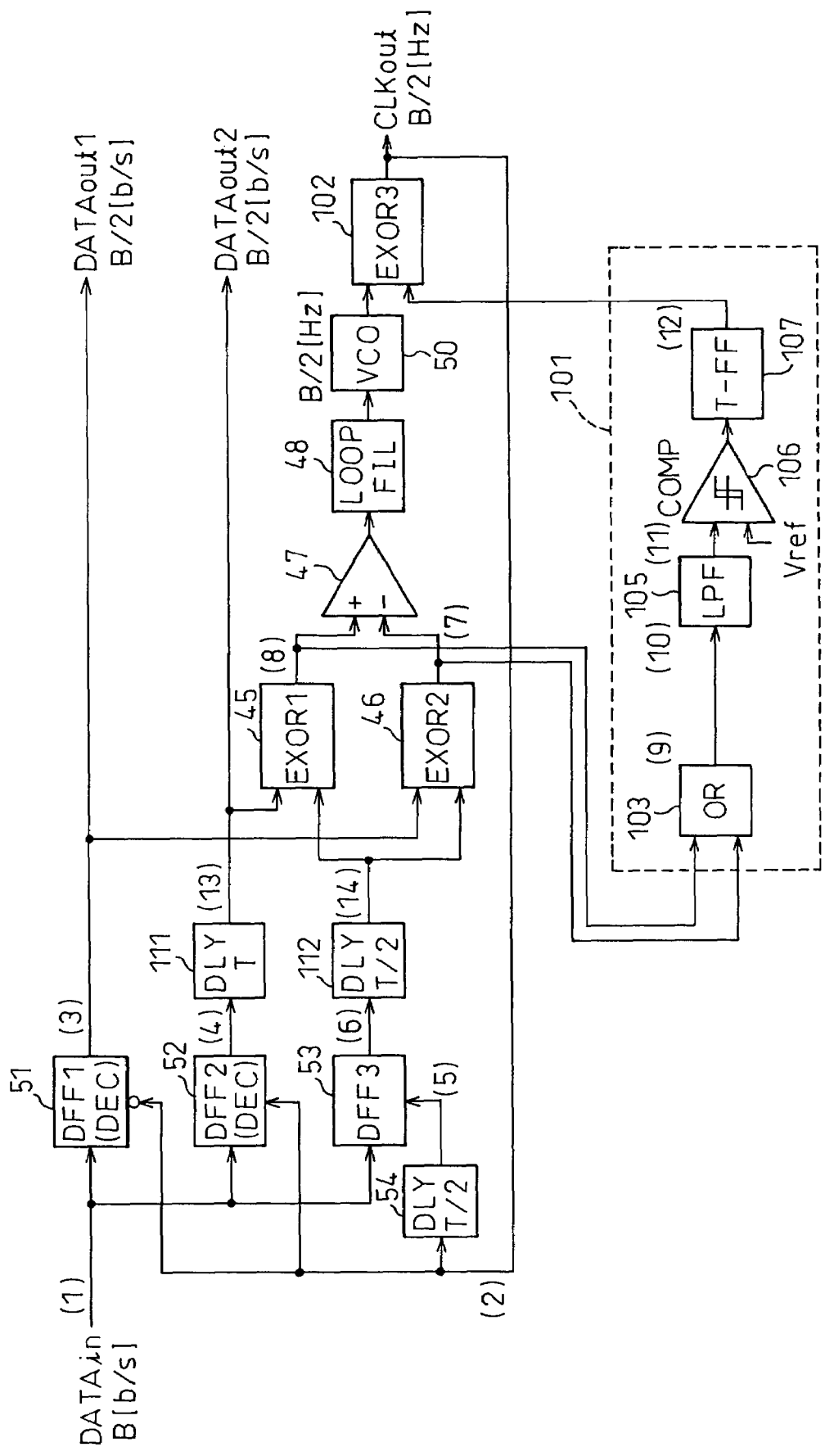
FIG. 16 is a diagram showing a specific implementation (3) of the first embodiment.

In FIG. 14, the high level pulses occurring in the EXOR output signals (7) and (8) in FIG. 7 due to the phase-shifted signals input to the EXOR circuits 45 and 46 are eliminated by aligning the phases by means of newly provided D-flip/flops 109 and 110, thereby obviating the need for the D-flip/flop 104 in the 1100 pattern continuous input handling circuit 101. This operation will be described with reference to the timing chart of FIG. 15; the D-flip/flops 109 and 110 respectively latch the synchronized signals (4) and (6) from the preceding stage by the inverted clock signal, and output synchronized signals (13) and (14). Accordingly, in the case of the delayed phase shown in part (a) of FIG. 15, the synchronized signals (13) and (14) are identical to each other, and their EXORed output signal (7) is at the low level. On the other hand, in the case of the advanced phase shown in part (b) of FIG. 15, the synchronized signals (13) and (14) are identical to each other, and their EXORed output signal (8) is at the low level. As a result, the D-flip/flop 104 provided to sample the points indicated by mark (x) in FIG. 7 is rendered unnecessary. In FIG. 16, the D-flip/flops 109 and 110 in FIG. 14 are replaced by delay circuits ill and 112. The operation timing is therefore the same as that shown in FIG. 15.

Figure 17:
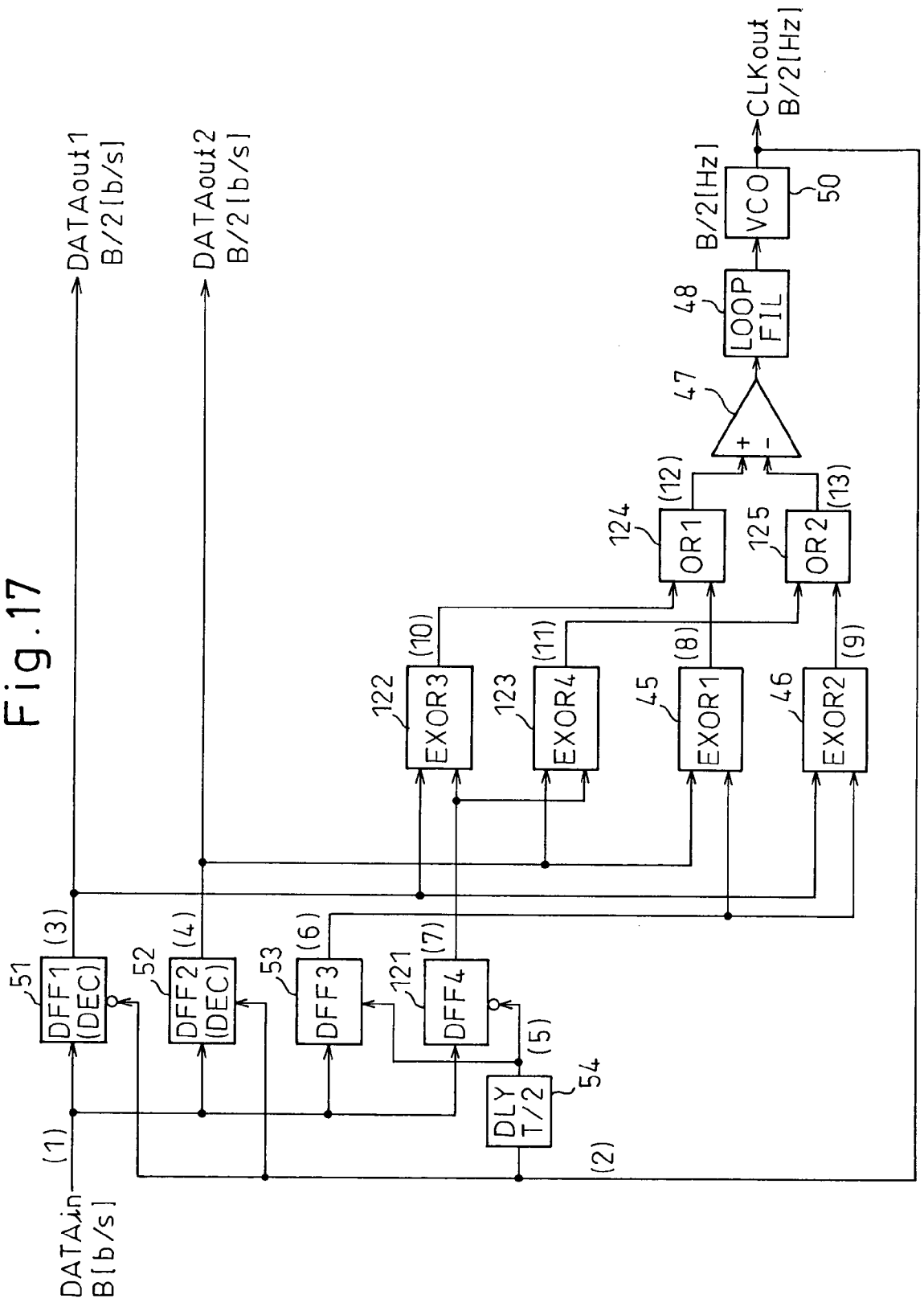
FIG. 17 is a diagram showing a second embodiment according to the present invention.
Figure 18:
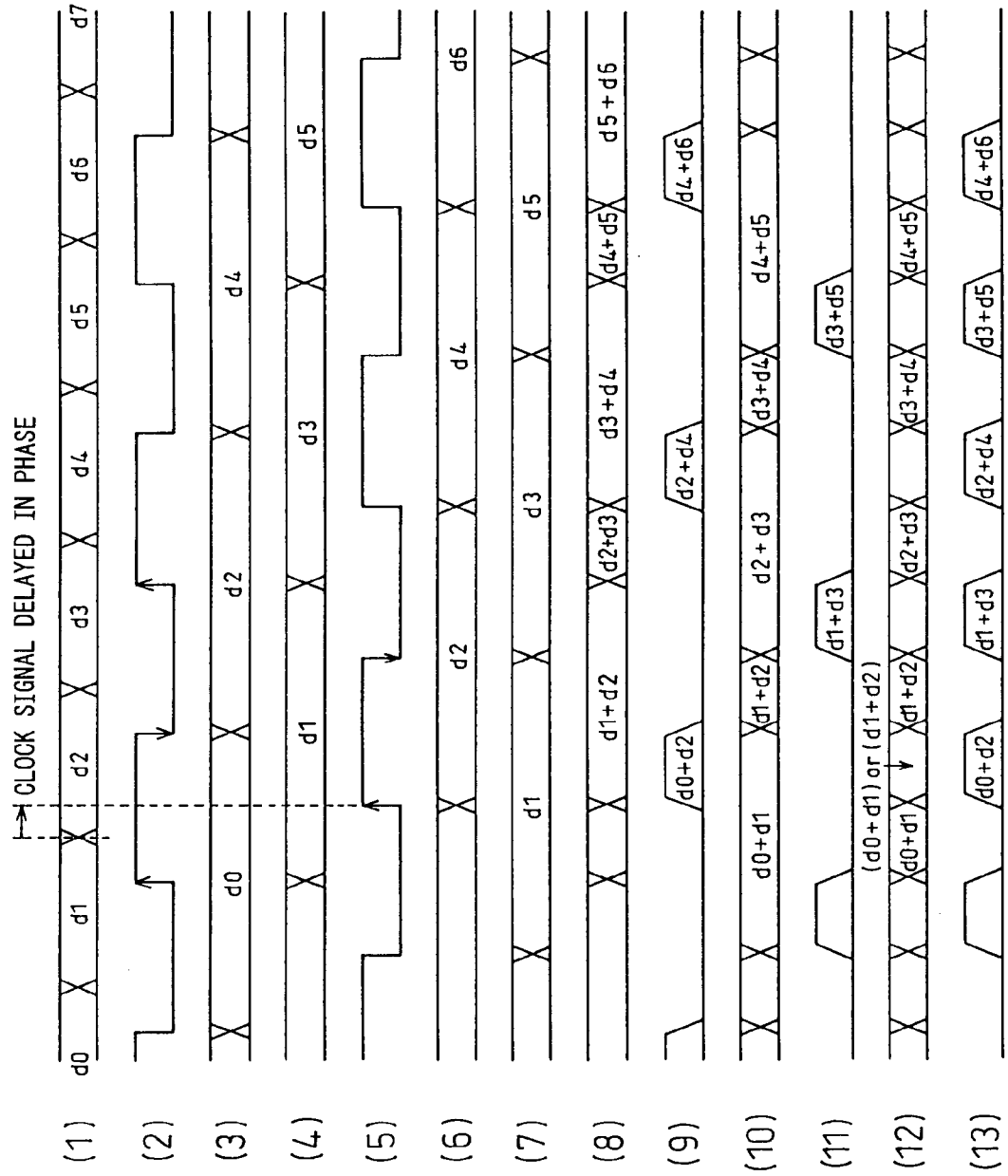
FIG. 18 is a timing chart (1) for FIG. 17.
Figure 19:
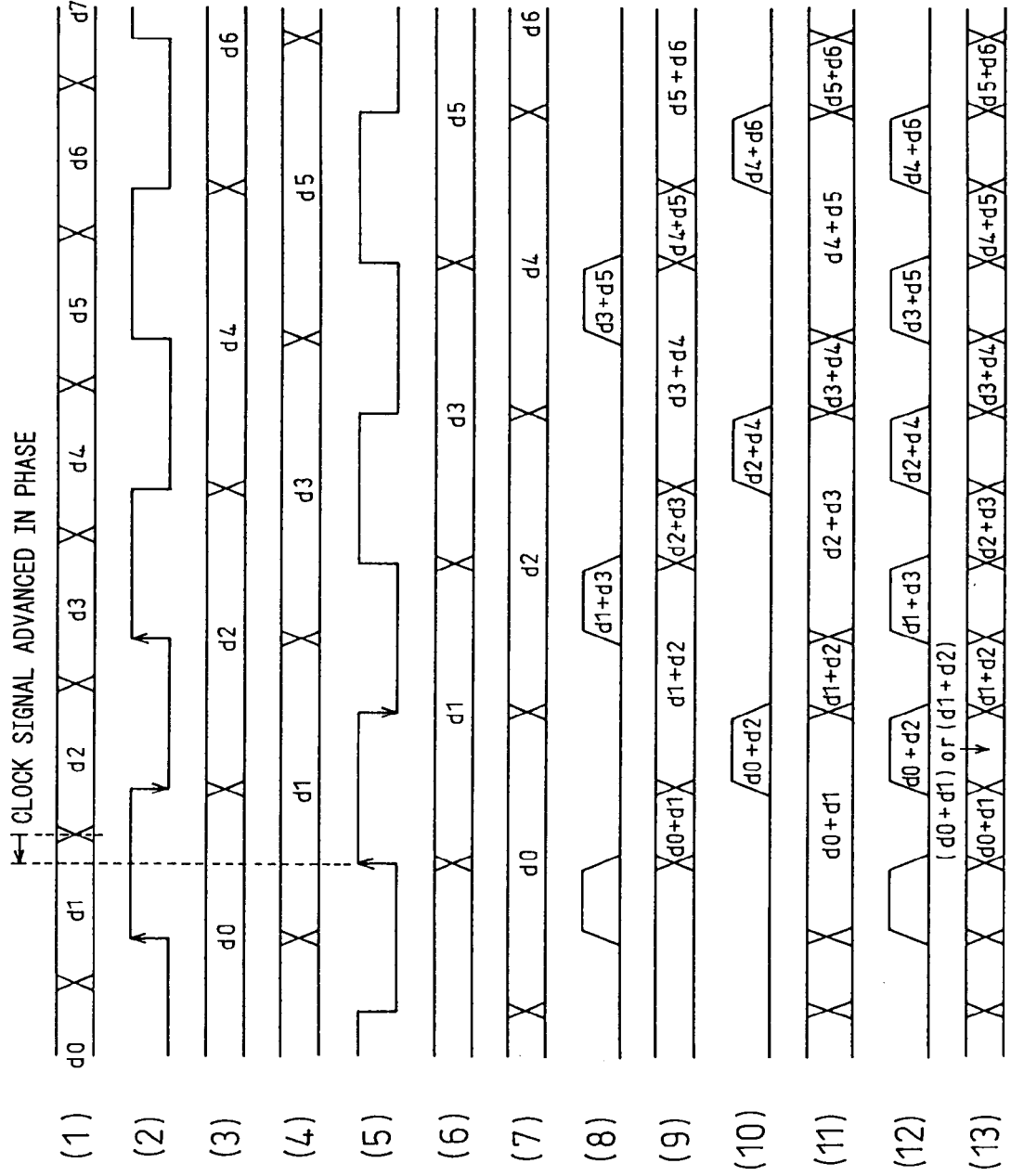
FIG. 19 is a timing chart (2) for FIG. 17.

FIG. 17 is a diagram showing a second embodiment according to the present invention. In this embodiment, all the data signal changes are used for phase comparison even in the half-frequency clock extraction method. That is, the phase relationships A and B are both detected. In FIG. 17, a D-flip/flop 121 is newly added, and an inverted version of the clock signal (5) is applied to it to detect a data signal change in the other one of every two data bits that was not detected in FIG. 3. To achieve this, EXOR circuits 122 and 123 are provided in combination with OR circuits 124 and 125 which produce OR signals by ORing the EXOR output signals (10) and (11) with the output signals (8) and (9) of the previously described EXOR circuits 45 and 46, respectively. The operation of this embodiment will be described with reference to the timing charts of FIGS. 18 to 21. FIG. 18 shows the case where the clock signal is 30 delayed in phase. In addition to the previously described case of FIG. 5, the synchronized signal (7) is generated by the falling edge of the clock signal (5). After that, the synchronized signals (3) and (7) are EXORed together to produce the EXOR output signal (10), and the synchronized signals (4) and (7) are EXORed together to produce the EXOR output signal (11). A level difference similar to the one occurring between the EXOR output signals (8) and (7) shown in part (a) of FIG. 5 (in the present embodiment, (8) and (9)) also occurs between the EXOR output signals (10) and (11). Accordingly, their ORed output signals (12) and (13) also have a similar level difference between them. Likewise, in the case of the advanced clock signal shown in FIG. 19, a level difference similar to the one shown in part (b) of FIG. 5 also occurs between the OR output signals (12) and (13). It can therefore be seen that the same phase control as implemented in FIG. 3 can also be implemented using the circuit configuration of FIG. 17. FIGS. 20 and 21 show timing charts for the phase relationships A and B corresponding to FIGS. 6 and 7, respectively. As is apparent from FIG. 21, in the present embodiment, one or the other is always in the phase relationship A. Accordingly, in both cases of FIGS. 20 and 21, a level difference usable for phase control always occurs between the OR output signals (12) and (13).

In this way, in a clock extraction circuit using a PLL for extracting a clock signal of a frequency equal to one half the bit rate of the data signal, stable PLL operation can be achieved by using the clock extraction circuit of the present invention, even in cases where 1100 appears in succession in the input signal pattern. Further, when the half-frequency clock extraction circuit is employed, requirements on the high-speed characteristics of devices can be relaxed.

Figure 22:
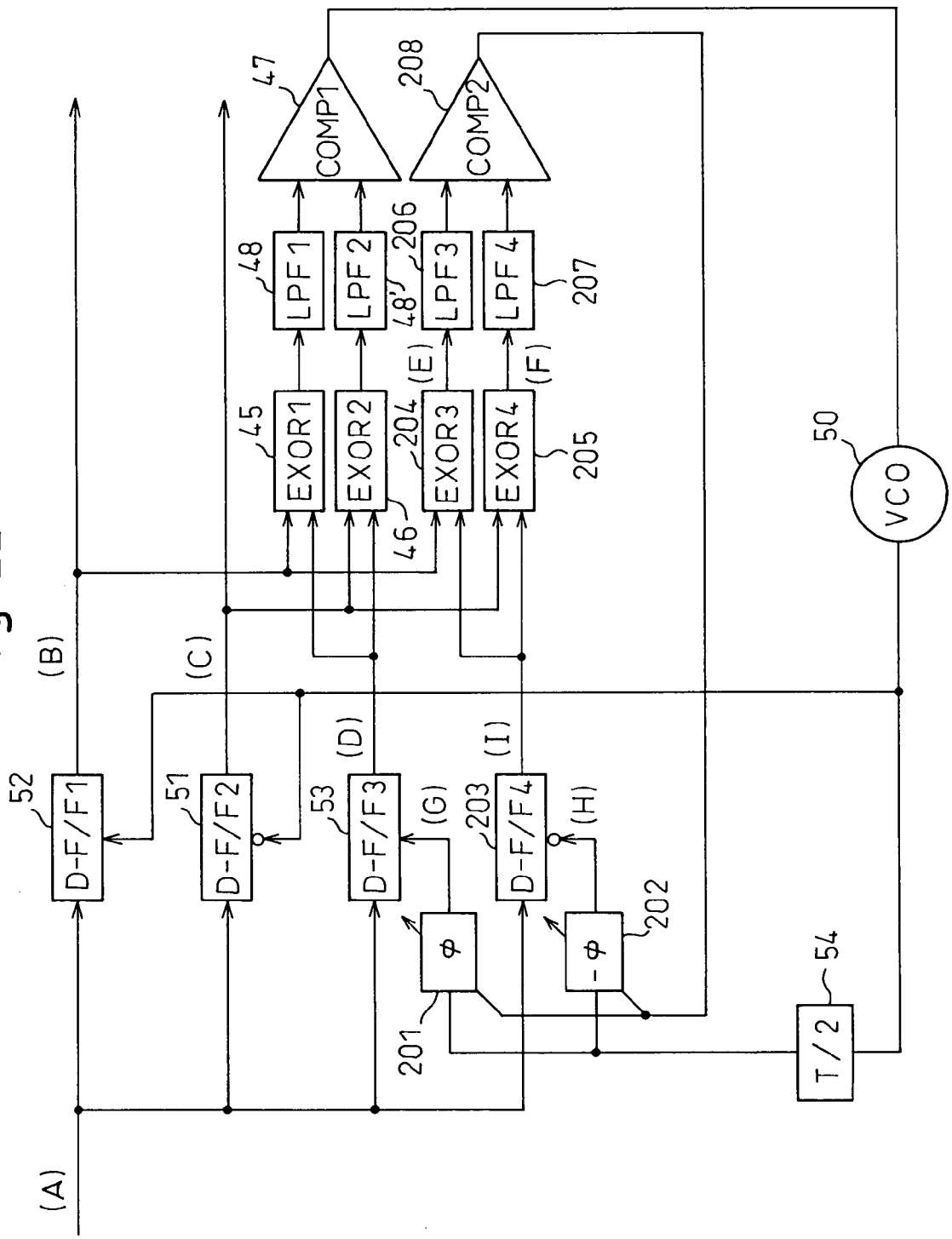
FIG. 22 is a diagram showing a third embodiment according to the present invention.
Figure 23:
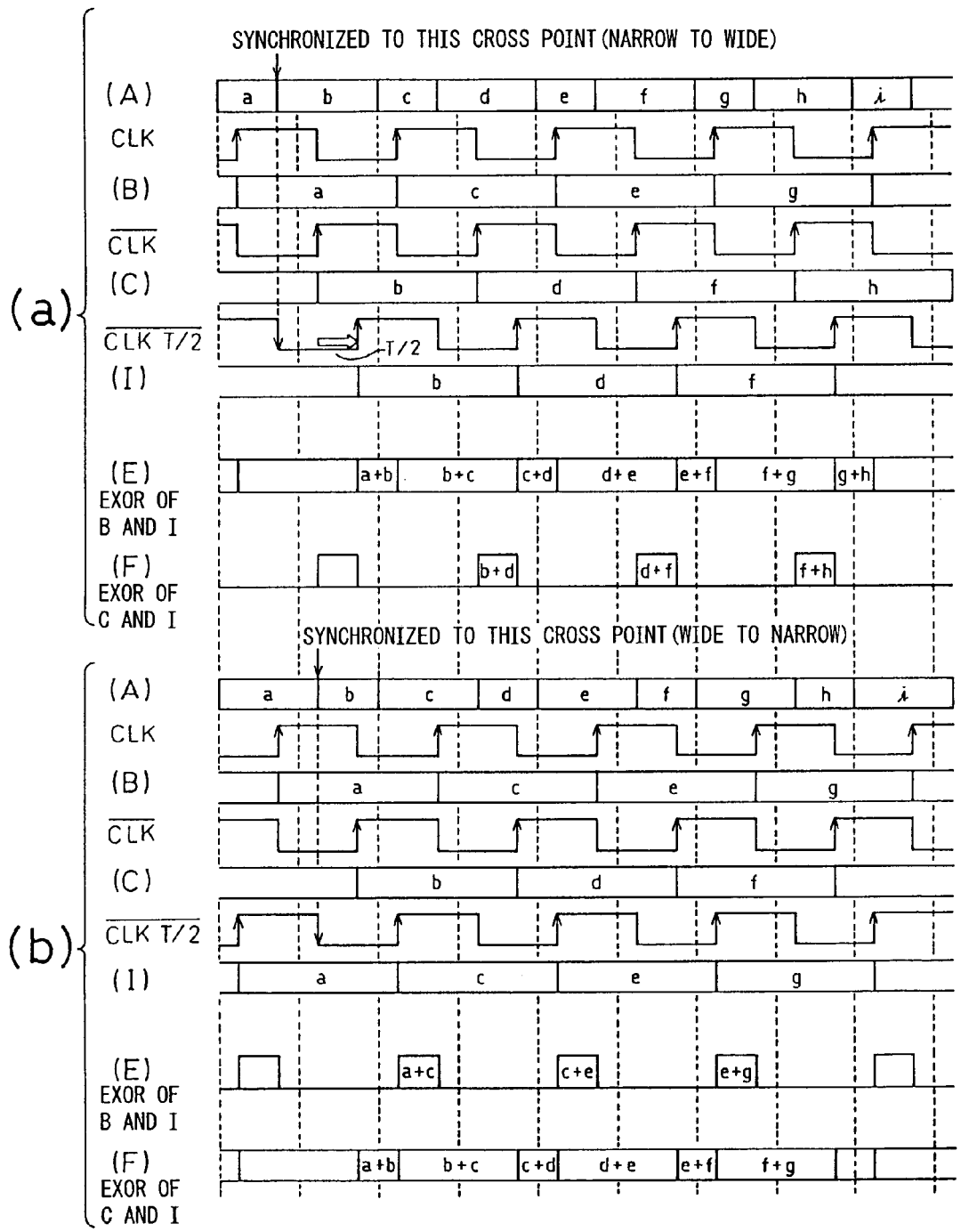
FIG. 23 is a timing chart (1) for FIG. 22.

FIG. 22 is a diagram showing a third embodiment according to the present invention, and FIG. 23 is a timing chart showing an example of operation at each point indicated by a parenthesized character in FIG. 22. In this embodiment, the discrimination phase for the received data is automatically controlled at the optical receiver 30 by determining whether the duty cycle of the received data signal is wide or narrow.

Figure 27:
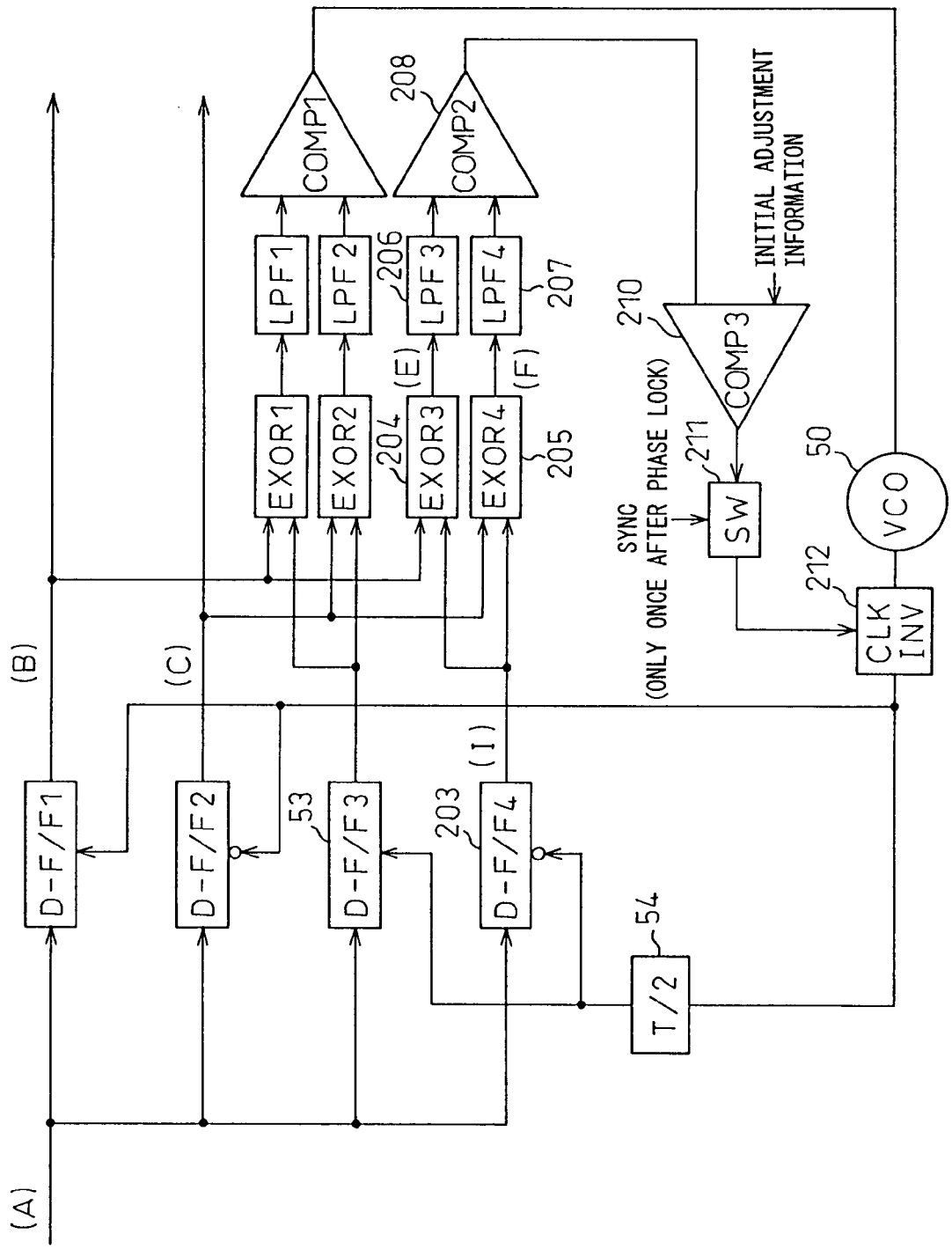
FIG. 27 is a diagram showing a fourth embodiment according to the present invention.

In FIGS. 22 and 27, circuit blocks indicated by reference numerals 2xx are newly added blocks for the present embodiment; otherwise, the circuit configuration is the same as that of the half-frequency clock extraction method previously explained with reference to FIG. 3. The following describes the operation of this embodiment, focusing on the newly added blocks. The received data signal (A) is input to the two discrimination circuits constructed from the D-flip/flops 51 and 52, and signals (B) and (C) respectively synchronized to the clock rising and falling edge signals from the PLL circuit are generated. The received data signal (A) is also input to the newly added D-flip/flop 203 as well as to the D-flip/flop 53. The clock signal from the PLL circuit is applied to the D-flip/flops 53 and 203 via the delay circuit 54, which provides a fixed delay of ¼ clock cycle, and via variable phase shifters 201 and 202, respectively, which are controlled by an output from a comparator 208 described later, and a signal (D) synchronized to the rising edge of a clock signal (G) to which a variable phase φ has been added is obtained from the D-flip/flop 53, while a signal (I) synchronized to the rising edge of a clock signal (H) from which the variable phase φ has been subtracted is obtained from the D-flip/flop 203.

Figure 5:
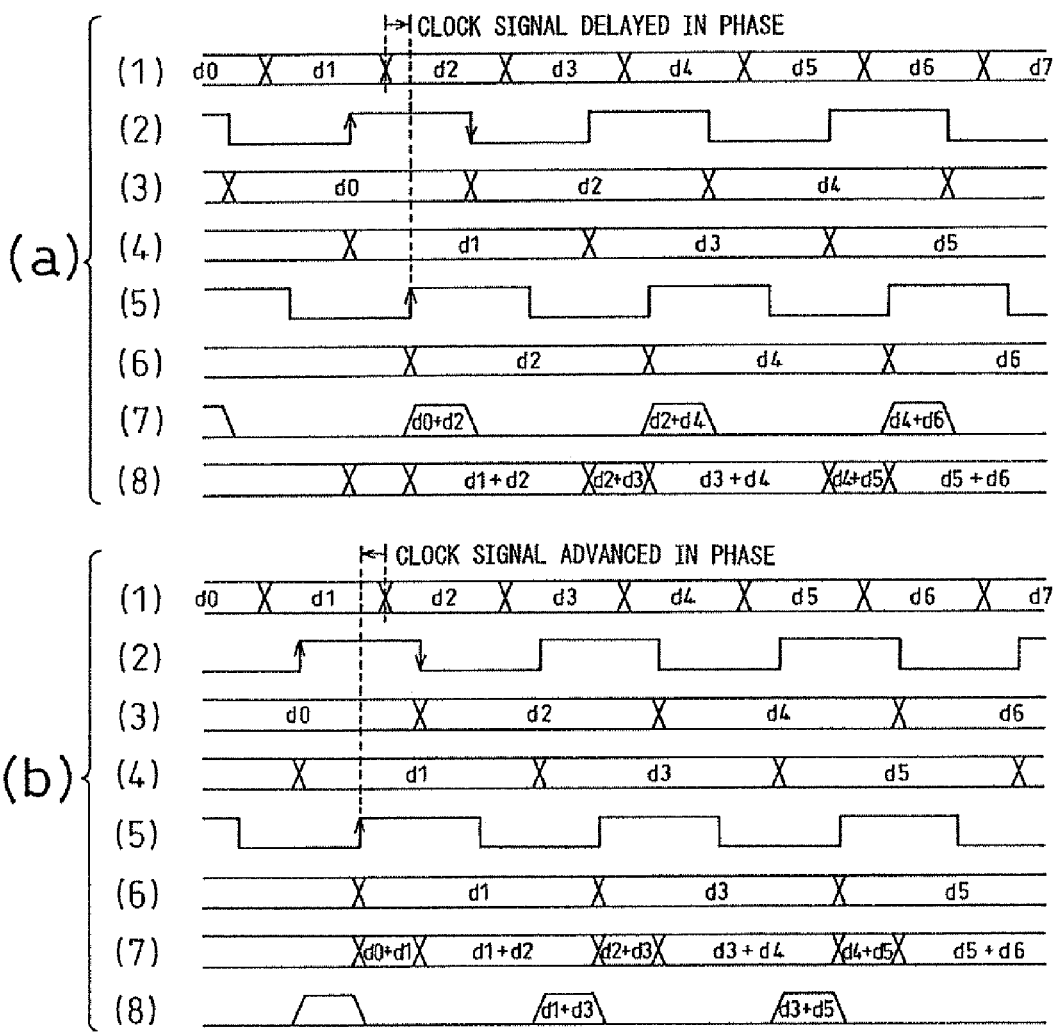
FIG. 5 is a timing chart for FIG. 3.

The EXOR circuits 45 and 46, the low-pass filters 48 and 48', and the comparator 47 operate in the same manner as in the prior art example shown in FIGS. 3 and 5; therefore, the PLL circuit operates so that the rising edge of the clock signal (G) coincides with the changing edge of the received data signal (A). The two low-pass filters 48 and 48' correspond to the common loop filter 48 in FIG. 3, and are provided one for each of the inputs of the comparator 47, and the operation of the PLL circuit itself is essentially the same. On the other hand, EXOR circuits 204 and 205, low-pass filters 206 and 207, and comparator 208, newly provided in this embodiment, constitute a circuit block that automatically controls the discrimination phase for the received data by determining whether the duty cycle of the received data signal (A) is wide or narrow and by variably changing the amount of phase shift in the variable phase shifters 201 and 202 at the next stage. Here, the EXOR circuit 204 produces an output signal (E) by EXORing the synchronized signals (B) and (I), and the EXOR circuit 205 produces an output signal (F) by EXORing the synchronized signals (C) and (I).

FIG. 23 shows a timing chart example for the state (θ and −θ=0) before the variable phase shifters 201 and 202 are controlled by the output of the comparator 208. Accordingly, when the PLL is in lock, the falling edge of the clock signal (H), the inverted version of the clock signal (G), coincides with the changing edge of the received data signal (A). Part (a) of FIG. 23 shows the case where the PLL is synchronized to the "narrow" to "wide" duty cycle change point of the received data signal (A). In this case, the average signal level (the output of the low-pass filter 206) of the output signal (E) produced by EXORing the synchronized signals (B) and (I) is high, and the average signal level (the output of the low-pass filter 207) of the output signal (F) produced by EXORing the synchronized signals (C) and (I) is lower than that. On the other hand, part (b) of FIG. 23 shows the case where the PLL is synchronized to the "wide" to "narrow" duty cycle change point of the received data signal (A). In this case, contrary to the case shown in part (a) of FIG. 23, the average signal level (the output of the low-pass filter 206) of the output signal (E) produced by EXORing the synchronized signals (B) and (I) is low, and the average signal level (the output of the low-pass filter 207) of the output signal (F) produced by EXORing the synchronized signals (C) and (I) is higher than that. In this way, by detecting the difference between the two average signal levels by the comparator 208 at the next stage, it can be determined whether the PLL is synchronized to the "narrow" to "wide" duty cycle change point or the "wide" to "narrow" duty cycle change point of the received data signal (A).

Figure 24:
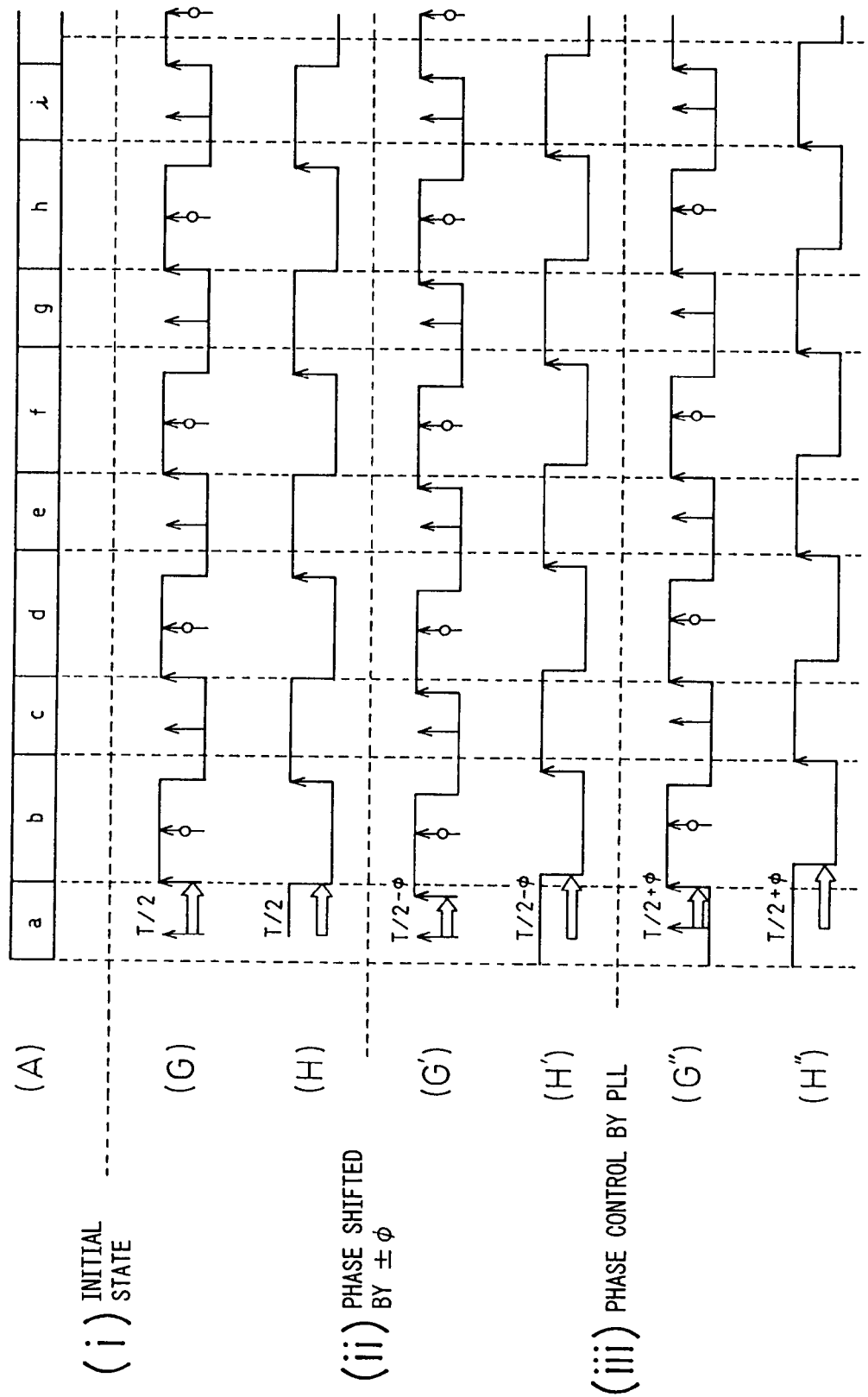
FIG. 24 is a timing chart (2) for FIG. 22.

FIG. 24 shows one example of the operation of the present invention, illustrating the clock signals (G) and (H) produced by the variable phase shifters 201 and 202 when the PLL is synchronized to the "narrow" to "wide" duty cycle change point as shown in part (a) of FIG. 23. In the initial state (i), since θ and −θ=0 as in part (a) of FIG. 23, the clock signal (H) is simply the inverted version of the clock signal (G). In this case, the average signal level of the exclusive-OR signal (E) is higher than the average signal level of the exclusive-OR signal (F), as described with reference to part (a) of FIG. 23, and the comparator 208 controls the variable phase shifter 201 to produce a clock signal (G') by subtracting a phase amount Φ from the "narrow" duty cycle (T/2−Φ), and controls the variable phase shifter 202 to produce a clock signal (H') by adding the phase amount Φ to the "wide" duty cycle (T/2+Φ), as shown in part (ii). As a result, as the PLL performs control so as to re-synchronize the clock signal (G'), as shown in part (iii), the data discrimination signals (sampling signals) before and after the re-synchronized clock signal (G") are each shifted to the center of the "narrow" or "wide" data bit width, respectively.

In this way, the clock signals (G) and (H) to be applied to the D-flip/flops 53 and 203 are shifted in opposite directions according to the output signal of the comparator 208 which changes depending on whether the PLL is synchronized to the narrow" to "wide" duty cycle change point or the "wide" to "narrow" duty cycle change point, and the clock signal (G) is re-synchronized by the PLL, thereby achieving automatic and optimum control of the data discrimination phase. This operation is repeated until the output of the comparator 208 becomes inverted, and eventually the discrimination phase is controlled to the center of the duty-deviated received waveform. The above also applies to the case where the initial phase is synchronized to the "wide" to "narrow" duty cycle change point. In that case, however, the addition/subtraction of the phase amount Φ in the variable phase shifter 201 is opposite to that described above.

Figure 25:
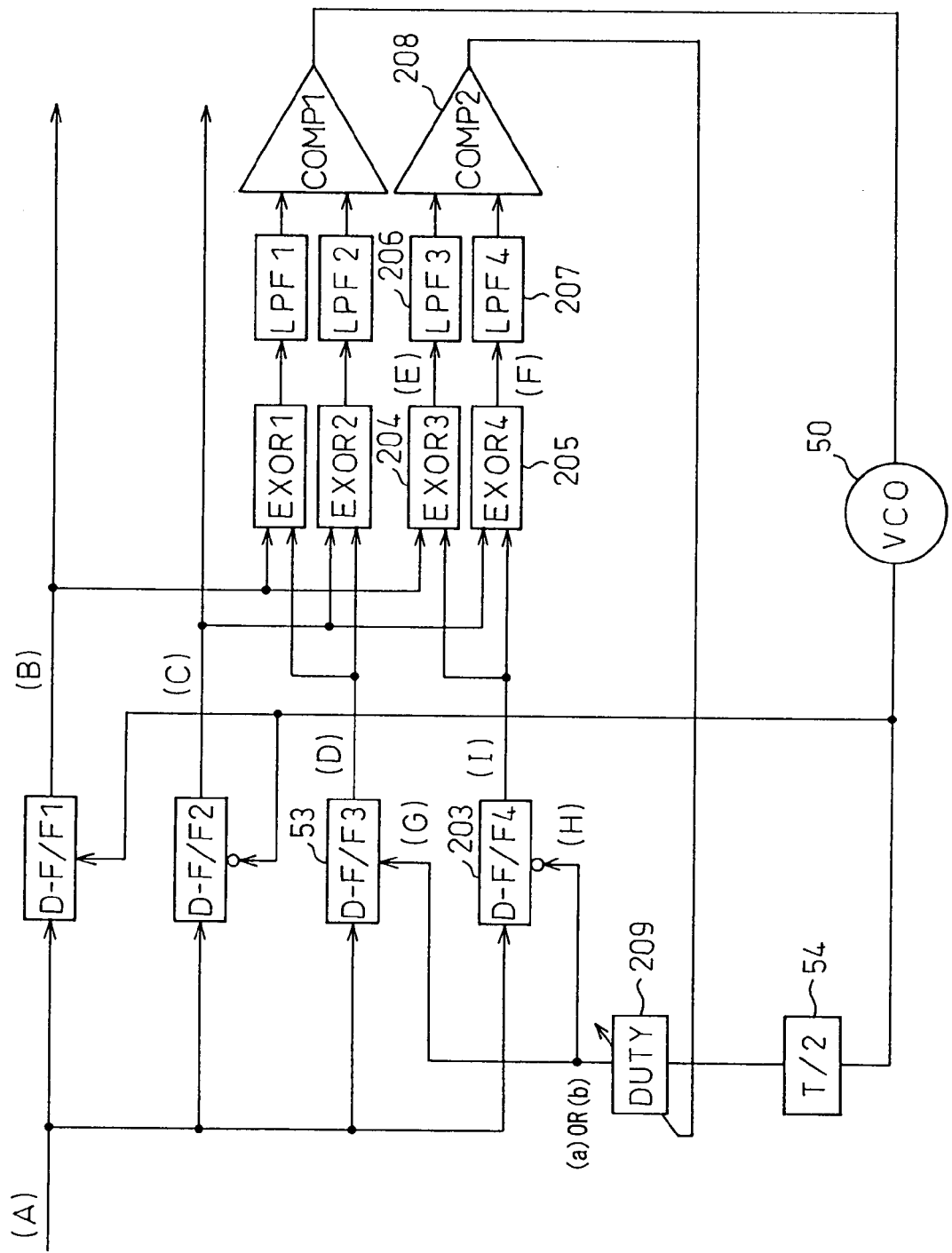
FIG. 25 is a diagram showing a specific implementation of the third embodiment.
Figure 26:
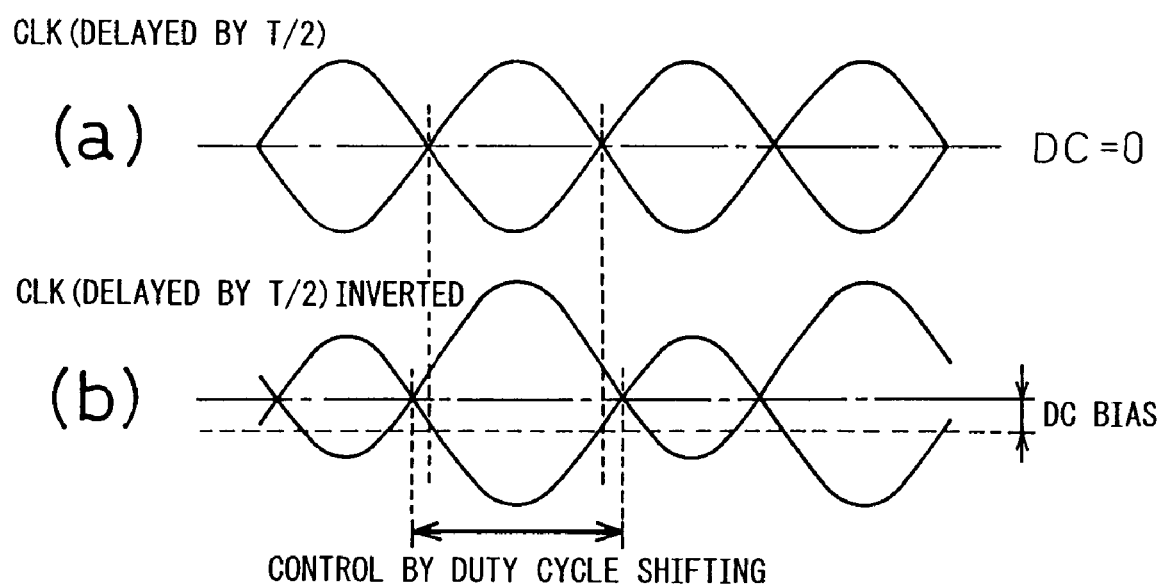
FIG. 26 is a signal waveform diagram for FIG. 25.

FIGS. 25 and 26 are diagrams showing a specific implementation of the third embodiment of FIG. 22. In FIG. 25, the two variable phase shifters 201 and 202 in FIG. 22 are replaced by a single duty adjusting circuit 209. FIG. 26 shows one configuration example of the duty adjusting circuit 209; in this example, the DC bias of the clock signal is simply varied by the output signal of the comparator 208. As the input logic discrimination threshold of the D-flip/flops 53 and 203 is fixed, the duty cycle of the clock signal is varied by varying the DC bias. As shown in FIG. 25, while keeping unchanged the clock signal whose DC bias is simply varied, the clock signal (G) to the D-flip/flop 53 and the clock signal (H) to the D-flip/flop 203 are varied in an opposite phase relationship (θ and −θ).

Figure 28:
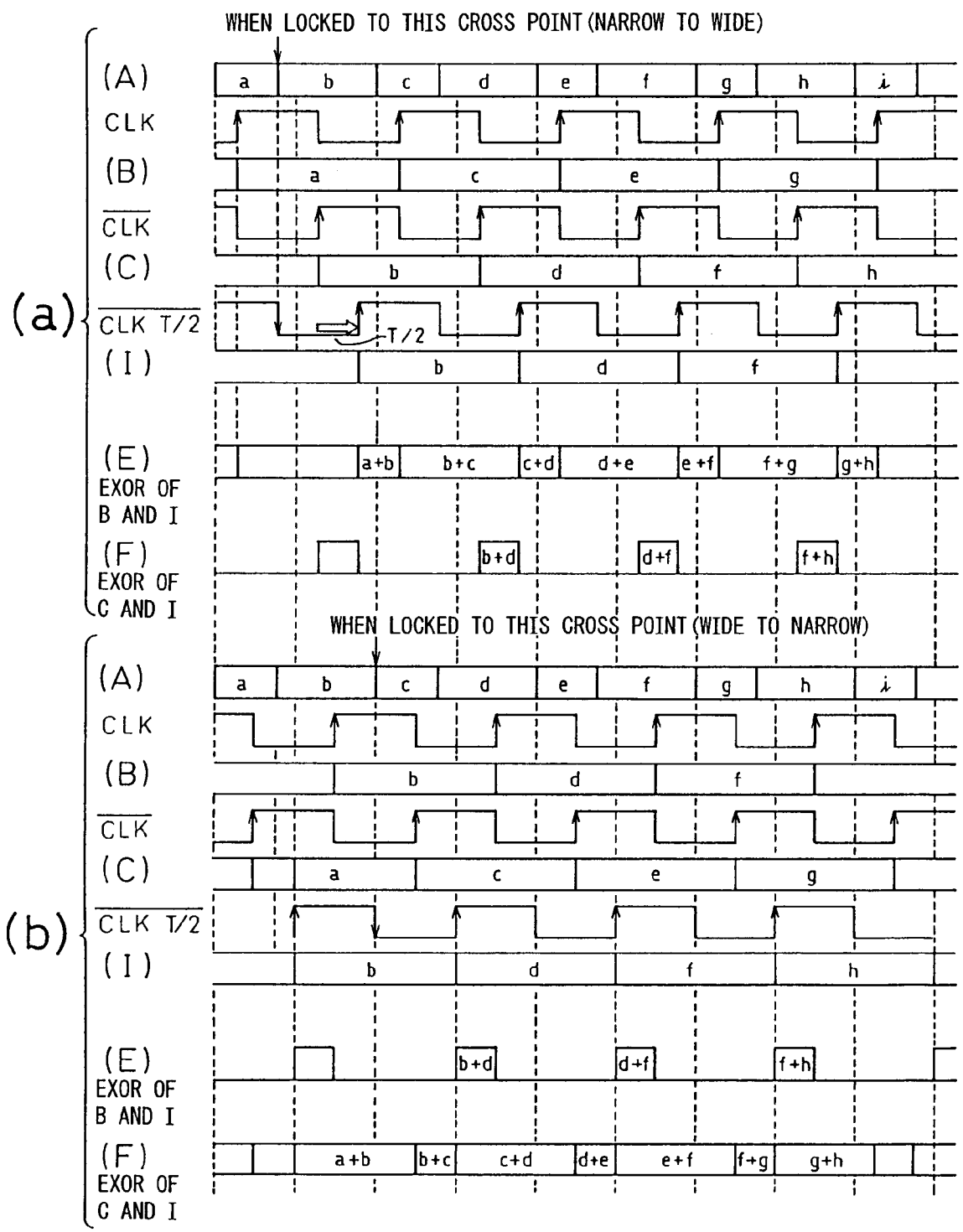
FIG. 28 is a timing chart for FIG. 27.
Figure 29:
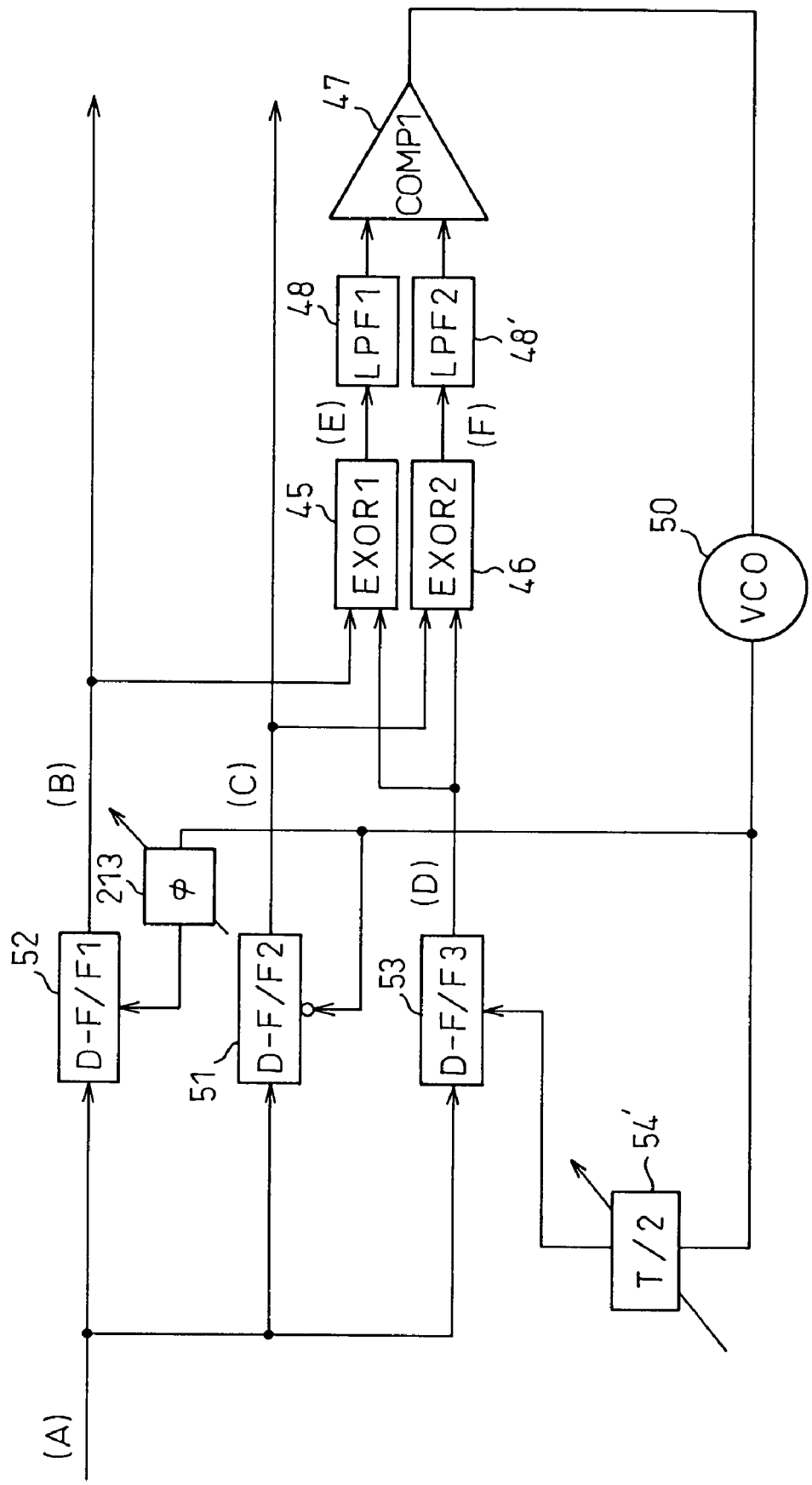
FIG. 29 is a diagram showing a specific implementation (1) of the fourth embodiment.

FIGS. 27 to 33 are diagrams showing a fourth embodiment according to the present invention. Here, FIG. 27 shows the basic configuration of the fourth embodiment of the present invention, and FIG. 28 is a timing chart showing an example of operation at each point indicated by a parenthesized character in FIG. 27. FIG. 29 and subsequent figures show specific implementations of the fourth embodiment. In this embodiment, the phase is controlled so as to match the initial phase setting at the optical receiver 30 by determining whether the duty cycle is wide or narrow.

As shown in FIG. 27, the basic configuration of this embodiment is the same as that shown in FIG. 22. That is, the D-flip/flop 203, the EXOR circuits 204 and 205, the low-pass filters 206 and 207, and the comparator 208 are provided to determine whether the duty cycle of the received data signal (A) is wide or narrow. In this embodiment, however, the discrimination phase for the received data is not automatically controlled based on that determination but, as a simple measure, an initial phase setting is performed to set the initial phase at either the "wide" to "narrow" or the "narrow" to "wide" duty cycle change point. The resulting initial adjustment information is given as a reference potential to the newly provided comparator 210. For example, suppose that the initial phase is set at the "wide" to "narrow" change point; in this case, when the PLL is locked to the "wide" to "narrow" change point, the same point as the initial phase setting, at power on to the optical receiver 30, for example, the output of the comparator 210 is maintained at the low level, but when the PLL is locked to the "narrow" to "wide" change point different from the initial phase setting, the output of the comparator 210 goes to the high level. This level signal is fed via a switch 211 to control an inverter 212, and the clock signal from the VCO 50 is thus inverted when the PLL is locked to the "wide" to "narrow" change point different from the initial phase setting. This causes the PLL to lock to the "wide" to "narrow" change point, the same point as the initial phase setting. This operation need be performed only once after establishing the phase lock; therefore, in this embodiment, the operation switch 211 which is operated manually or by program control is provided, and the switch is turned ON only once after detecting the phase lock. FIG. 28 shows the case where the initial phase is set at the "wide" to "narrow" change point: Part (a) of FIG. 28 shows the case where the initial phase is locked to the "narrow" to "wide" change point different from the initial phase setting, and part (b) of FIG. 28 shows the case where the inverter 212 is enabled by the output of the comparator 210 to invert the clock signal, causing the initial phase to lock to the "wide" to "narrow" change point, the same point as the initial phase setting.

Figure 30:
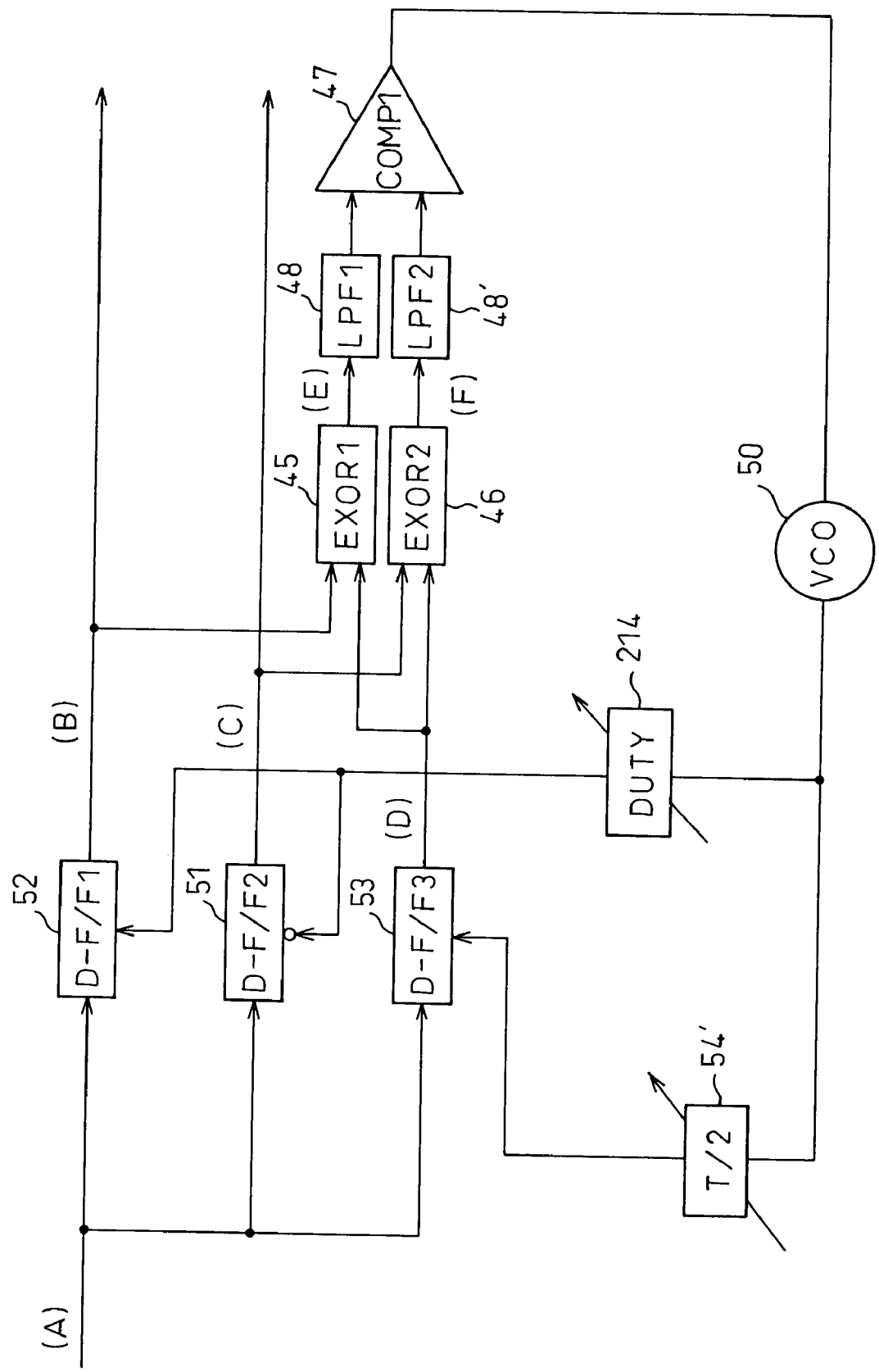
FIG. 30 is a diagram showing a specific implementation (2) of the fourth embodiment.
Figure 31:
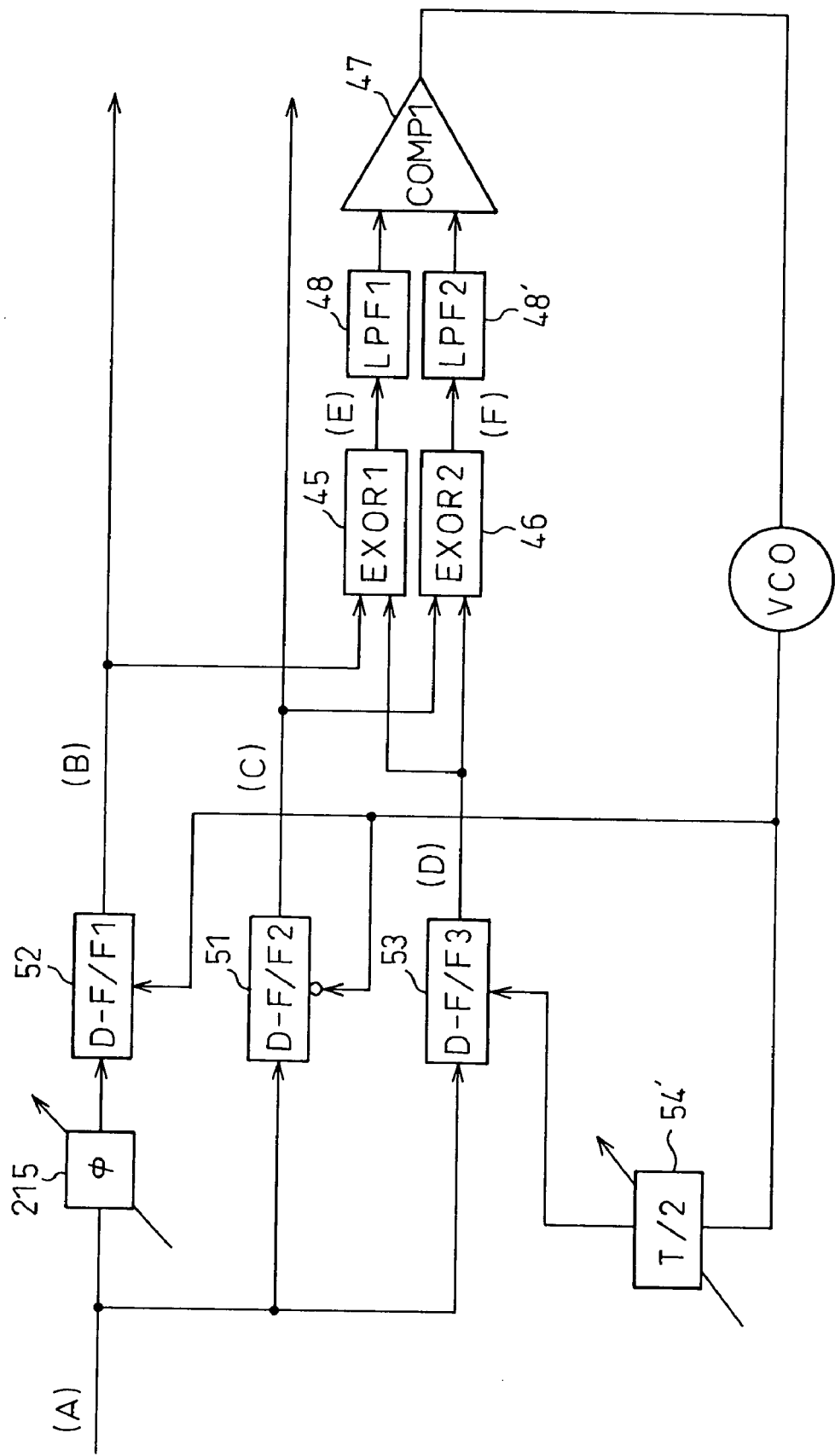
FIG. 31 is a diagram showing a specific implementation (3) of the fourth embodiment.
Figure 32:
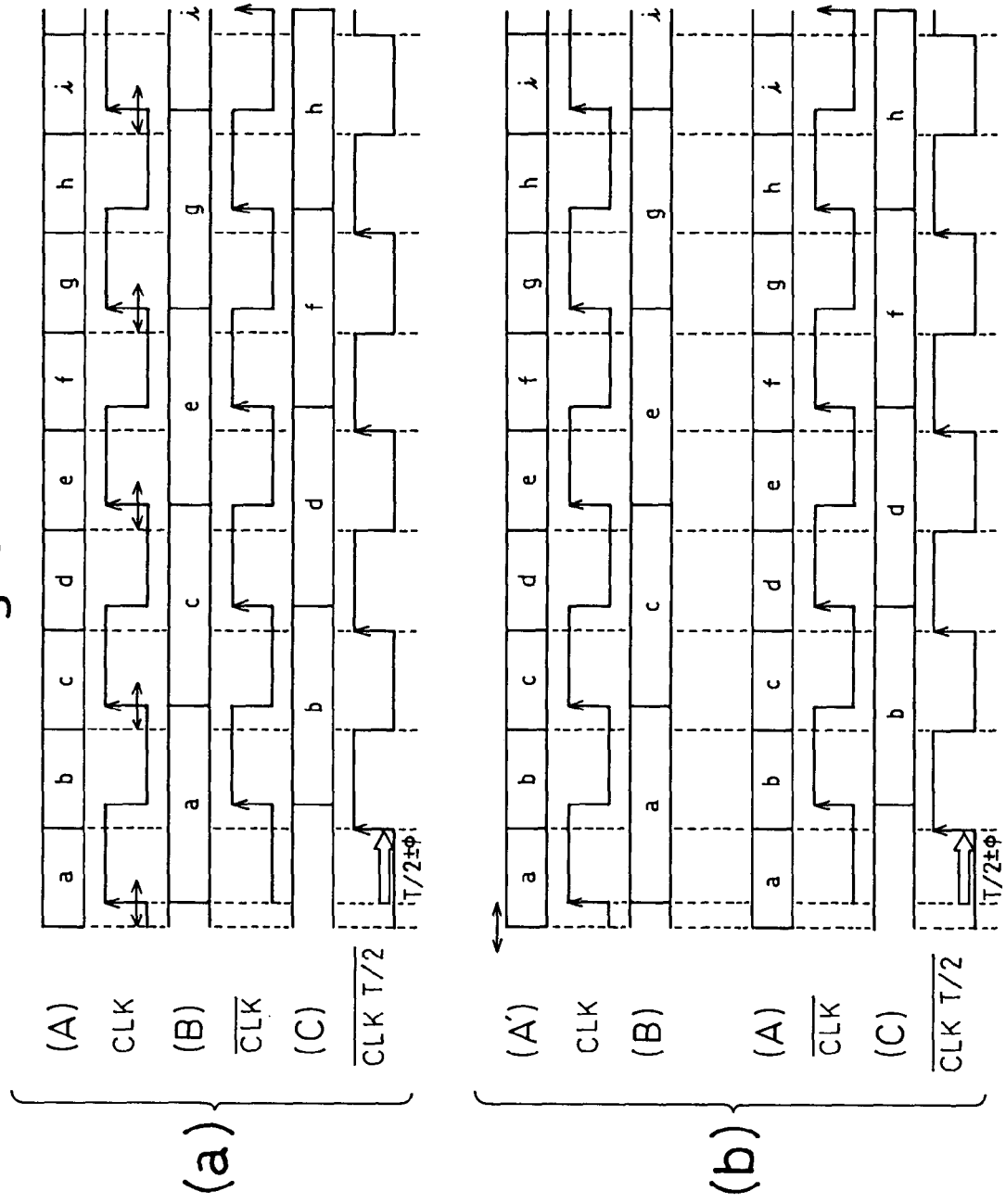
FIG. 32 is a timing chart for FIGS. 29 to 31.

FIGS. 29 to 31 show three configuration examples for adjusting the initial phase. Each example is based on the prior art configuration of FIG. 3, and the adjustment is performed while maintaining the locked condition with the rising edge of the T/2-delayed clock kept synchronized to the changing edge of the received data signal (A). In FIG. 29, a phase shifter 213 is provided only for the clock signal to the D-flip/flop 52 so that the discrimination phase of the clock signal for discriminating the data signal and the discrimination phase of its inverted clock signal can be adjusted precisely and independently of each other. A variable delay circuit 54' is provided to adjust the phases of the output signals (B) and (C) between the D-flip/flops 52 and 51. In the configuration shown in FIG. 30, a duty adjusting circuit 214 similar to the one previously described with reference to FIGS. 25 and 26 is provided to adjust the discrimination phase between the clock signal for discriminating the data signal and its inverted clock signal. In the configuration shown in FIG. 31, a variable phase shifter 215 is provided only on the received data (A) input side of the D-flip/flop 52; this achieves an effect equivalent to that obtained in FIG. 29. Part (a) of FIG. 32 shows a timing chart example for FIGS. 29 and 30, and part (b) of FIG. 32 shows a timing chart example for FIG. 31. By combining any of these initial adjustments with the fourth embodiment shown in FIG. 27, a simple configuration for handling "wide" to "narrow" or "narrow" to "wide" duty cycle changes of the received data signal can be achieved.

Figure 8:
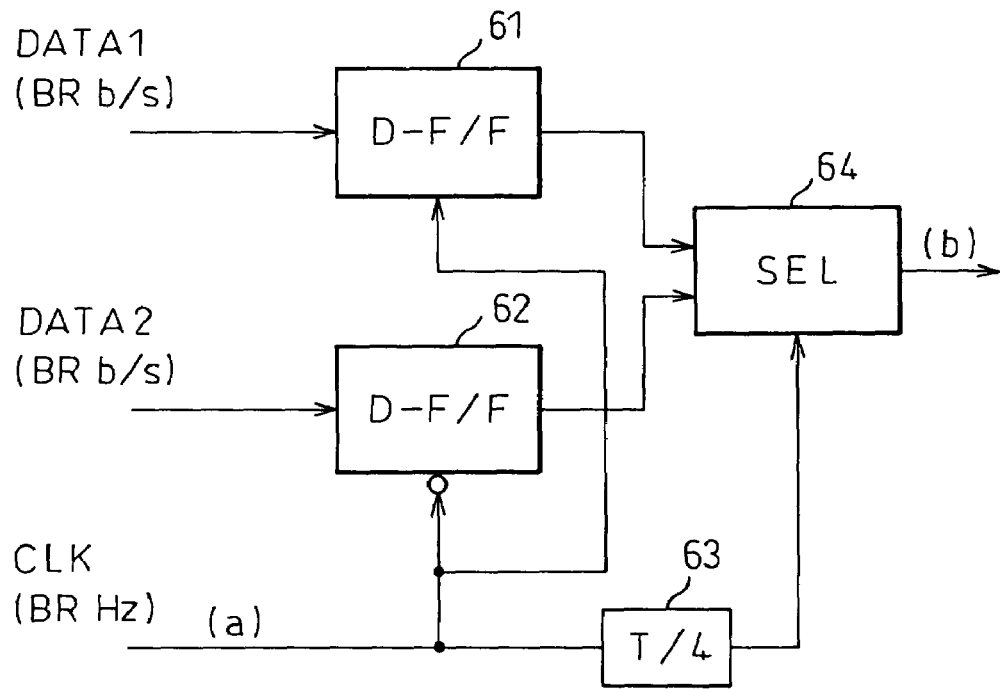
FIG. 8 is a diagram showing a circuit configuration example of an output stage of a 2:1 multiplexing circuit.
Figure 9:
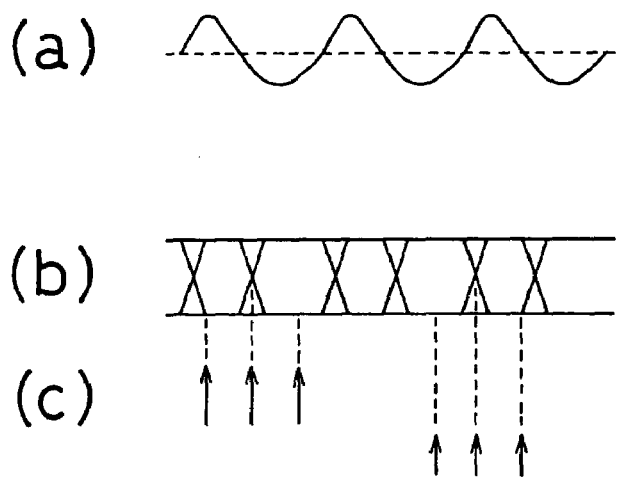
FIG. 9 is a diagram showing a signal waveform example.

FIG. 33 is a diagram showing a fifth embodiment according to the present invention. In this embodiment, a duty compensating circuit 221 or 222 for compensating for the duty cycle of the clock waveform is provided for the previously described 2:1 multiplexing circuit of FIG. 8 in the optical transmitter 10. With the provision, the duty cycle deviation occurring every other bit can be eliminated from the transmitted waveform. FIGS. 34 and 39 each show a specific circuit configuration example of the duty compensating circuit 221 or 222. In FIG. 34, by detecting the average value of the transmitted data signal using a simple RC average value detection circuit 224, the DC bias is varied to compensate for the duty cycle of the transmitted waveform. In FIG. 35, the duty cycle of the clock signal is compensated for by using a simple band-pass filter 226 and DC-cut capacitor coupling 227.

As described above, according to the present invention, an early implementation of a higher-speed optical receiver circuit becomes possible by using the clock extraction circuit of the present invention, without the need to improve the high-speed characteristics of devices. Furthermore, according to the present invention, it becomes possible to prevent the error rate from degrading due to a shift in discrimination phase associated with the duty cycle deviation that occurs every other bit in a configuration where waveform shaping is not performed in the optical transmitter by the clock operating at the data transmission rate.

What is claimed is:

1. A discrimination circuit for a data signal having duty cycle deviation for use in an optical receiver, comprising:
 a phase locked loop (PLL) circuit containing a phase comparator circuit for performing a phase comparison between a data signal of bit rate B (bits/s) and a clock signal of B/2 (Hz) at intervals of 2/B (sec);
 a duty cycle evaluation circuit for evaluating a duty cycle between input data before and after a point at which said PLL circuit is locked; and
 a control circuit for controlling, based on a result of said evaluation, a data discrimination phase before and after the point at which said PLL circuit is locked, wherein:
 said control circuit includes an initial phase setting circuit in which duty cycle information representing an initial phase adjustment is set; and
 said initial phase setting circuit compares said duty cycle information representing said initial phase adjustment with an output of said duty cycle evaluation circuit and, when locked in phase in the same condition as said duty cycle information representing said initial phase adjustment, said locked condition is maintained, but when locked in phase in a condition different from said duty cycle information representing said initial phase adjustment, a clock output of a voltage-controlled oscillator in said PLL circuit is inverted.

2. A discrimination circuit for a data signal having duty cycle deviation for use in an optical receiver, comprising:
 a phase locked loop (PLL) circuit containing a phase comparator circuit for performing a phase comparison between a data signal of bit rate B (bits/s) and a clock signal of B/2 (Hz) at intervals of 2/B (sec);
 a duty cycle evaluation circuit for evaluating a duty cycle between input data before and after a point at which said PLL circuit is locked; and
 a control circuit for controlling, based on a result of said evaluation, a data discrimination phase before and after the point at which said PLL circuit is locked, wherein:
 said PLL circuit discriminates said input data every other bit by using said clock signal whose frequency is equal to one half the data transmission rate and an inverted version of said clock signal, and achieves a phase lock in accordance with a result obtained by a first exclusive-ORing the data discriminated by a clock signal delayed in phase by one half cycle of said data signal with the data discriminated by said half-frequency clock signal and the data discriminated by the inverted version of said half-frequency clock signal, respectively, and by comparing average values of sums of said respective first exclusive-OR,
 said duty cycle evaluation circuit evaluates said duty cycle to determine whether said duty cycle changes from "narrow" to "wide" or from "wide" to "narrow" between said input data before and after the point at which said PLL circuit is locked, said evaluation being made based on a result obtained by a second exclusive-ORing the data discriminated by an inverted version of said clock signal delayed in phase by one half cycle of said data signal with the data discriminated by said half-frequency clock signal and the inverted version of said half-frequency clock signal, respectively, and by comparing average values of sums of said respective second exclusive-OR, and
 said control circuit, based on the result of said evaluation, controls the phase of said clock signal delayed in phase by one half cycle of said data signal and the phase of the inverted version of said clock signal respectively in opposite directions.

3. A circuit as claimed in claim 2, wherein the discrimination phases of said clock signal and the inverted version thereof for discriminating said data signal are adjusted independently of each other by adjusting the phase of said clock signal independently of the phase of said clock signal delayed in phase by one half cycle of said data signal.

* * * * *

UNITED STATES PATENT AND TRADEMARK OFFICE
CERTIFICATE OF CORRECTION

PATENT NO. : 7,643,601 B2
APPLICATION NO. : 10/642519
DATED : January 5, 2010
INVENTOR(S) : Takuji Yamamoto It is certified that error appears in the above-identified patent and that said Letters Patent is hereby corrected as shown below:

Title Page, Column 1, Line 2, Item [12], under "(12) United States Patent", change "Kuwata et al." to --Yamamoto--.

Title Page, Column 1, Item [75], (Inventors), Line 1, before "Takuji" delete "Naoki Kuwata, Kawasaki (JP);".

Column 14, Lines 14-15, claim 2, change ""narrow"to "wide"or from "wide "to "narrow" between" to --"narrow" to "wide" or from "wide" to "narrow" between--.

Signed and Sealed this

Sixth Day of April, 2010

David J. Kappos
*Director of the United States Patent and Trademark Office*